(12) United States Patent
Kim et al.

(10) Patent No.: US 12,727,348 B2
(45) Date of Patent: Sep. 1, 2026

(54) DISPLAY PANEL INCLUDING DUMMY HOLE AND METHOD FOR MANUFACTURING THE SAME

(71) Applicant: Samsung Display Co., Ltd., Yongin-si (KR)

(72) Inventors: Donguk Kim, Yongin-si (KR); Chaungi Choi, Yongin-si (KR); Hyunho Kim, Yongin-si (KR); Hyoeng-Ki Kim, Yongin-si (KR); Hyeonbum Lee, Yongin-si (KR); Hoongi Lee, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 451 days.

(21) Appl. No.: 18/330,494

(22) Filed: Jun. 7, 2023

(65) Prior Publication Data

US 2024/0081113 A1 Mar. 7, 2024

(30) Foreign Application Priority Data

Sep. 5, 2022 (KR) ........................ 10-2022-0111970

(51) Int. Cl.
*H10K 59/12* (2023.01)
*H10K 59/124* (2023.01)
(Continued)

(52) U.S. Cl.
CPC ....... *H10K 59/131* (2023.02); *H10K 59/1201* (2023.02); *H10K 59/124* (2023.02); *H10K 59/88* (2023.02)

(58) Field of Classification Search
CPC ............. H10K 59/131; H10K 59/1201; H10K 59/188; H10K 59/124
(Continued)

(56) References Cited

U.S. PATENT DOCUMENTS 9,356,259 B2 5/2016 Mun et al.
9,917,206 B2 3/2018 Koezuka
(Continued)

FOREIGN PATENT DOCUMENTS

CN 113053309 6/2021
KR 10-2016-0098601 A 8/2016
(Continued)

OTHER PUBLICATIONS

Extended European Search Report for European Patent Application No. 23194386.1, dated Feb. 1, 2024.

*Primary Examiner* — Phuc T Dang
(74) *Attorney, Agent, or Firm* — Harness, Dickey & Pierce, P.L.C.

(57) ABSTRACT

A display panel including a plurality of insulating layers, a light emitting element disposed above the plurality of insulating layers, a first transistor including an oxide semiconductor pattern, and a first gate disposed above the oxide semiconductor pattern, and a first dummy conductive pattern spaced apart from the first transistor. A first dummy hole is defined spaced apart from the first transistor in a direction perpendicular to a thickness direction and penetrating first contact insulating layers in contact with at least the first transistor among the plurality of insulating layers. The first dummy conductive pattern is disposed in the first dummy hole.

13 Claims, 18 Drawing Sheets

(51) Int. Cl.
*H10K 59/131* (2023.01)
*H10K 59/88* (2023.01)

(58) Field of Classification Search
USPC .......................................................... 257/72
See application file for complete search history.

(56) References Cited

U.S. PATENT DOCUMENTS

| | | | | |
|---|---|---|---|---|
| 11,011,594 | B2 | 5/2021 | Kim et al. | |
| 2016/0233253 | A1 | 8/2016 | Kim | |
| 2018/0248045 | A1* | 8/2018 | Lim | H10D 30/6755 |
| 2021/0183984 | A1 | 6/2021 | Park et al. | |
| 2022/0157918 | A1* | 5/2022 | You | H10K 59/88 |

FOREIGN PATENT DOCUMENTS

| | | |
|---|---|---|
| KR | 10-2019-0115135 A | 10/2019 |
| KR | 10-2111022 | 5/2020 |
| KR | 10-2021-0077861 | 6/2021 |
| KR | 10-2264976 | 6/2021 |
| KR | 10-2022-0069487 | 5/2022 |

* cited by examiner

DISPLAY PANEL INCLUDING DUMMY HOLE AND METHOD FOR MANUFACTURING THE SAME

CROSS-REFERENCE TO RELATED APPLICATION(S)

This U.S. non-provisional patent application claims priority to and benefits of Korean Patent Application No. 10-2022-0111970 under 35 U.S.C. § 119, filed on Sep. 5, 2022, the entire contents of which are incorporated herein by reference.

BACKGROUND

1. Technical Field

The disclosure relates to a display panel including a dummy hole and a method of manufacturing the same.

2. Description of Related Art

Multimedia display devices such as televisions, mobile phones, tablet computers, navigation devices, and game machines have a display panel for displaying images. The display panel may include a light emitting element and transistors for driving the light emitting element. Light emitting elements included in the display panel may emit light according to a voltage applied from a circuit and generate an image. In order to improve the reliability of the display panel, research on light emitting elements and transistors is being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display panel including a dummy hole through which hydrogen may be readily discharged.

The disclosure also provides a method of manufacturing a display panel including forming a dummy hole through which hydrogen may be readily discharged.

An embodiment of the disclosure provides a display panel that may include a plurality of insulating layers, a light emitting element disposed above the plurality of insulating layers, a first transistor including an oxide semiconductor pattern, and a first gate disposed above the oxide semiconductor pattern, and a first dummy conductive pattern spaced apart from the first transistor. A first dummy hole may be defined spaced apart from the first transistor in a direction perpendicular to a thickness direction, and may penetrate first contact insulating layers in contact with at least the first transistor among the plurality of insulating layers. The first dummy conductive pattern may be disposed in the first dummy hole.

In an embodiment, the first contact insulating layers may include a first insulating layer disposed between the oxide semiconductor pattern and the first gate, and the first dummy hole may penetrate the first insulating layer.

In an embodiment, in the direction, a first separation distance between the first dummy hole and the oxide semiconductor pattern may be about 10 μm or less.

In an embodiment, the display panel may include a display area and a non-display area, and the first dummy hole may overlap the display area.

In an embodiment, the display panel may further include a second transistor disposed above a layer different from the first transistor, and a second dummy conductive pattern spaced apart from the second transistor. The second transistor may include a silicon semiconductor pattern and a second gate disposed above the silicon semiconductor pattern. A second dummy hole passing through second contact insulating layers in contact with at least the second transistor among the plurality of insulating layers may be defined. The second dummy conductive pattern may be disposed in the second dummy hole.

In an embodiment, in the direction, a second separation distance between the second dummy hole and the silicon semiconductor pattern may be about 10 μm or less.

In an embodiment, the second contact insulating layers may include a second insulating layer disposed between the silicon semiconductor pattern and the second gate, and the second dummy hole may penetrate the second insulating layer.

In an embodiment, the first dummy hole may penetrate the second insulating layer.

In an embodiment, the display panel may further include an upper electrode disposed above the second gate.

In an embodiment, the first dummy conductive pattern and the second dummy conductive pattern may include a same metal material.

In an embodiment, the display panel may further include a buffer layer disposed below the plurality of insulating layers, wherein an upper surface of the buffer layer may be exposed through the first dummy hole.

In an embodiment of the disclosure, a method of manufacturing a display panel may include preparing a base layer, forming an oxide semiconductor pattern above the base layer, forming a first insulating layer directly disposed above the oxide semiconductor pattern, forming a first gate directly disposed above the first insulating layer, forming a first dummy hole spaced apart from the oxide semiconductor pattern and the first gate and passing through the first insulating layer, and forming a first dummy conductive pattern by providing a first metal material to the first dummy hole.

In an embodiment, the forming of the first dummy hole may include etching the first insulating layer resulting in an etched area, and providing heat to the etched area.

In an embodiment, the providing of the heat may be performed at a temperature of about 370° C. or higher and about 390° C. or lower.

In an embodiment, the method may further include before the forming of the oxide semiconductor pattern, forming a buffer layer above the base layer, forming a silicon semiconductor pattern above the buffer layer, forming a second insulating layer directly disposed above the silicon semiconductor pattern, and forming a second gate directly disposed above the second insulating layer. The method may further include after the forming of the first gate, forming a second dummy hole spaced apart from the silicon semiconductor pattern and the second gate and passing through the second insulating layer, and forming a second dummy conductive pattern by providing a second metal material in the second dummy hole.

In an embodiment, the method may further include after the forming of the first gate, forming a first contact hole electrically connected to the silicon semiconductor pattern, wherein the first dummy hole and the first contact hole may be formed in a same operation.

In an embodiment, the first dummy hole and the second dummy hole may be formed in a same operation.

In an embodiment, the first dummy hole may be formed to pass through the second insulating layer.

In an embodiment, the first metal material and the second metal material may be same.

In an embodiment, the method may further include, after the forming of the first dummy hole, forming a second contact hole electrically connected to the second gate.

In an embodiment, the forming of the second contact hole may not include providing heat.

In an embodiment, the method may further include, after the forming of the first dummy hole, forming a third contact hole electrically connected to the first gate.

In an embodiment, the forming of the third contact hole may not include providing heat.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings:

FIG. 7 is a schematic cross-sectional view illustrating a display panel according to an embodiment;

FIG. 8 is a schematic cross-sectional view illustrating a display panel according to an embodiment;

DETAILED DESCRIPTION OF THE EMBODIMENTS

Figure 1:
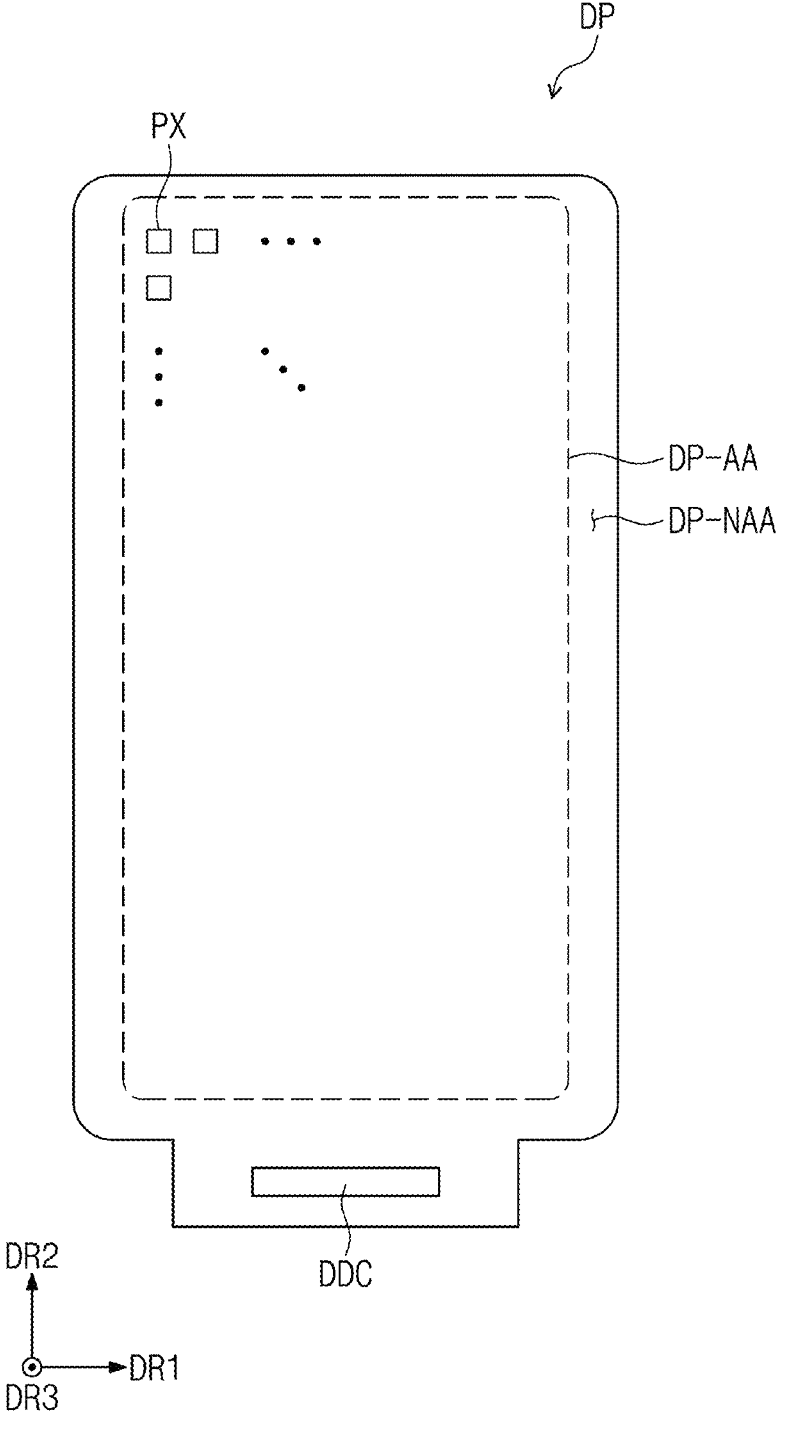
FIG. 1 is a schematic plan view illustrating a display panel according to an embodiment.

Since the disclosure may have various changes and may have various forms, specific embodiments are illustrated in the drawings and described in detail in the text. However, this is not intended to limit the disclosure to specific embodiments, and should be understood to include all modifications, equivalents and substitutes included in the spirit and scope of the disclosure.

In this specification, when an element (or region, layer, part, etc.) is referred to as being "on", "connected to", or "coupled to" another element, it may mean that it may be directly placed on/connected to/coupled to other components, or one or more other components may be arranged between them.

Like reference numerals refer to like elements. Additionally, in the drawings, the thicknesses, proportions, and dimensions of components may be exaggerated for effective description.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

It will be understood that the terms "first" and "second" are used herein to describe various components but these components should not be limited by these terms. The above terms are used only to distinguish one component from another. For example, a first component may be referred to as a second component and vice versa without departing from the scope of the disclosure. The terms of a singular form may include plural forms unless otherwise specified.

In addition, terms such as "below", "the lower side", "on", and "the upper side" may be used to describe a relationship of components shown in the drawings. The terms are described as a relative concept and may be based on a direction shown in the drawing.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and may mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied, all terms (including technical and scientific terms) used herein have the same meaning as commonly understood by one of ordinary skill in the art to which this disclosure belongs. In addition, terms such as those defined in commonly used dictionaries should be interpreted as having a meaning consistent with the meaning in the context of the related technology, and should not be construed in an overly ideal or overly formal sense unless explicitly defined herein.

FIG. 1 is a schematic plan view illustrating a display panel according to an embodiment.

Referring to FIG. 1, a display panel DP according to an embodiment may include a display area DP-AA and a non-display area DP-NAA. The non-display area DP-NAA may be adjacent to the display area DP-AA and may surround at least a part of the display area DP-AA. The pixel PX may be disposed in the display area DP-AA, and multiple wirings and driving circuits may be disposed in the non-display area DP-NAA. A data driving circuit DDC may be disposed at one side of the non-display area DP-NAA. The display area DP-AA may be an area in which a picture (or image) is displayed, and the non-display area DP-NAA may be an area in which a picture (or image) is not displayed.

The display area DP-AA may include a plane defined by the first direction axis DR1 and the second direction axis DR2. In the present specification, the first direction axis DR1 and the second direction axis DR2 may be orthogonal to each other, and the third direction axis DR3 may be a direction normal to a plane defined by the first direction axis DR1 and the second direction axis DR2. The directions indicated by the first to third direction axes DR1, DR2, and DR3 described herein are relative concepts and may be converted into other directions. Also, directions indicated by the first to third direction axes DR1, DR2, and DR3 may be described as the first to third directions, and the same reference numerals may be used.

The thickness direction of the display panel DP may be parallel to the third direction axis DR3 which is a direction normal to a plane defined by the first direction axis DR1 and the second direction axis DR2. In the present specification, the front (or upper surface) and rear (or lower surface) of the members constituting the display panel DP may be defined based on the third direction axis DR3. In this specification, "plane" may mean a plane defined by the first direction axis DR1 and the second direction axis DR2, and "cross-section" may mean a cross-section perpendicular to the plane and parallel to the third direction axis DR3.

The display panel DP may be a light emitting display panel. For example, the display panel DP may be an organic light emitting display panel, an inorganic light emitting display panel, a micro LED display panel, a micro OLED display panel, or a nano LED display panel.

Figure 2:
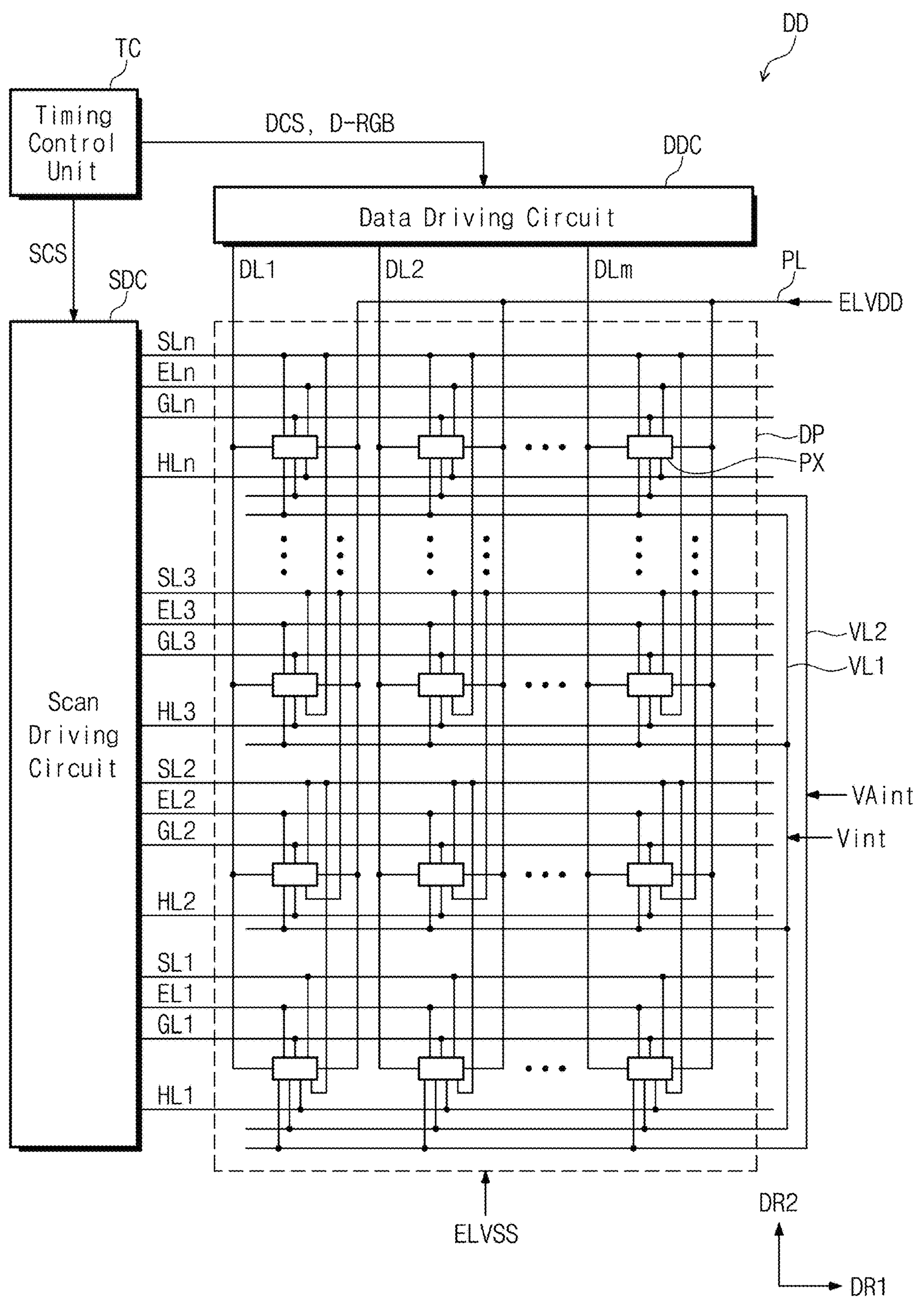
FIG. 2 is a schematic block diagram of a display device according to an embodiment.
Figure 3:
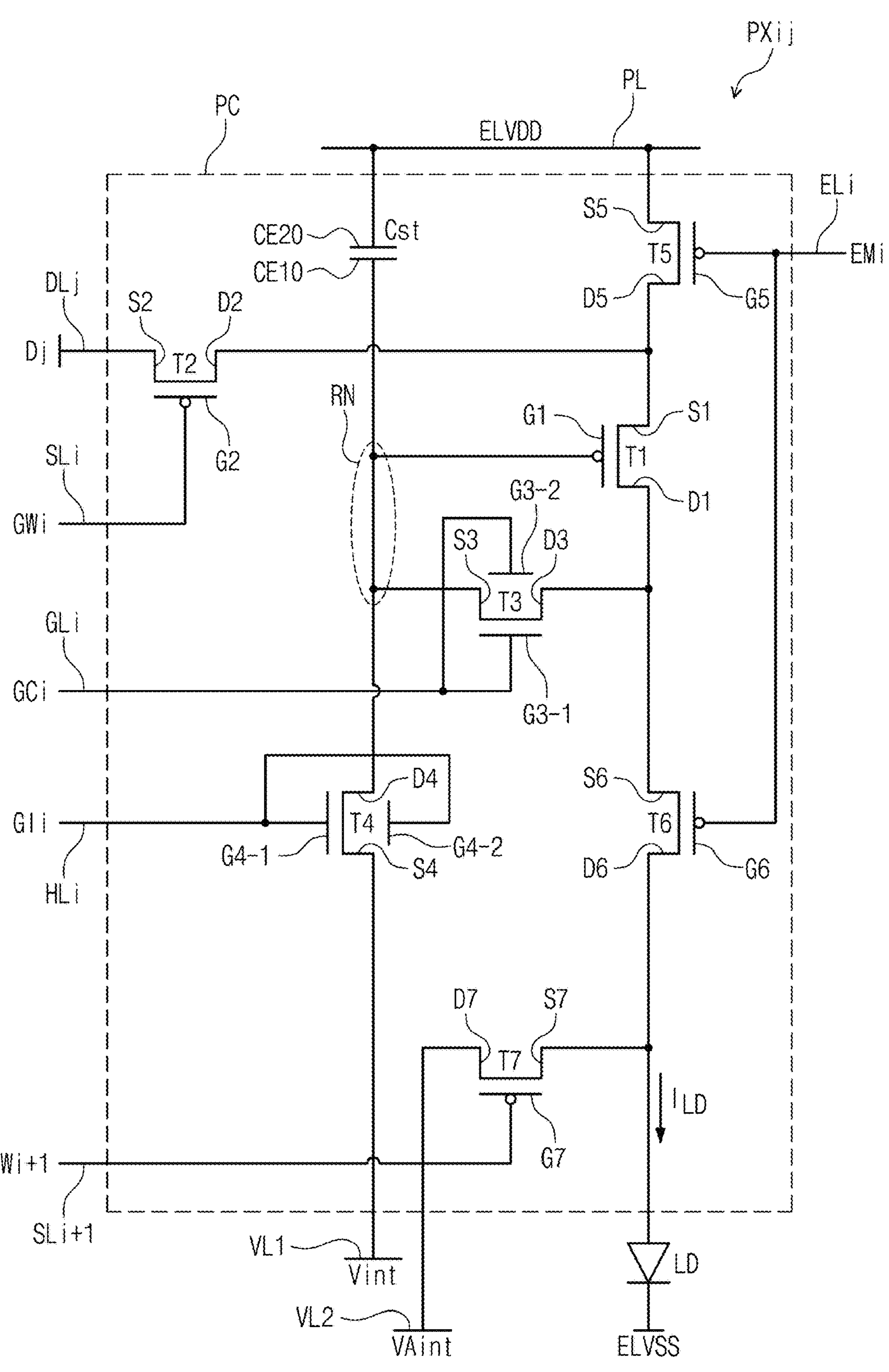
FIG. 3 is a schematic diagram of an equivalent circuit of a pixel according to an embodiment.
Figure 4:
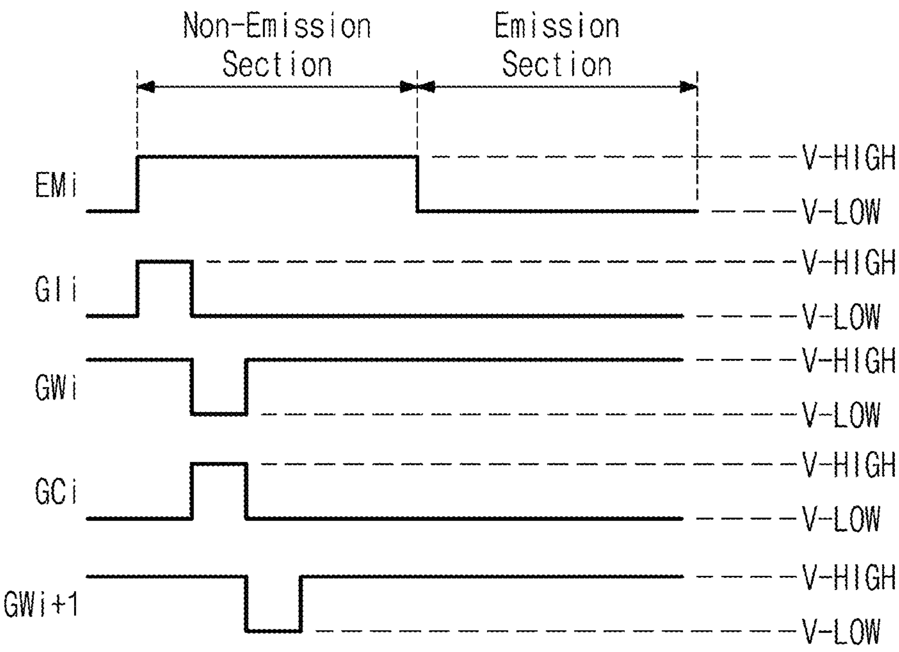
FIG. 4 is a schematic waveform diagram of driving signals for driving a pixel according to an embodiment.

FIG. 2 is a schematic block diagram of a display device DD according to an embodiment. FIG. 3 is a schematic diagram of an equivalent circuit of a pixel PX according to an embodiment. FIG. 4 is a schematic waveform diagram of driving signals for driving the pixel PX according to an embodiment.

Referring to FIG. 2, the display device DD may include a display panel DP, a timing control unit TC, a scan driving circuit SDC, and a data driving circuit DDC. At least one of the timing control unit TC, the scan driving circuit SDC, and the data driving circuit DDC may be provided in the form of a driving chip or may be directly formed on the display panel DP. In this specification, that a component is "directly formed/arranged" on another component may mean that a third component is not formed/disposed between a certain component and another component. When a component is "directly formed/disposed" on another component, it may mean that the component is in "contact" with another component.

The timing control unit TC may receive the input image signals, convert the data format of the input image signals to meet the interface specification with the scan driving circuit SDC, and generate the image data D-RGB. The timing control unit TC may output image data D-RGB and various control signals DCS and SCS.

The scan driving circuit SDC may receive the scan control signal SCS from the timing control unit TC. The scan control signal SCS may include a vertical start signal for starting the operation of the scan driving circuit SDC, a clock signal for determining output timing of the signals, and the like. The scan driving circuit SDC may generate multiple scan signals and sequentially output the scan signals to the corresponding signal lines SL1 to SLn, GL1 to GLn, and HL1 to HLn. Also, the scan driving circuit SDC may generate multiple emission control signals in response to the scan control signal SCS and output the emission control signals to the corresponding emission lines EL1 to ELn.

The data driving circuit DDC may receive the data control signal DCS and image data D-RGB from the timing control unit TC. The data driving circuit DDC may convert the image data D-RGB into data signals and output the data signals to multiple data lines DL1 to DLm to be described later. The data signals may be analog voltages corresponding to grayscale values of the image data D-RGB.

The multiple groups of signal lines may include a first group of scan lines SL1 to SLn, a second group of scan lines GL1 to GLn, a third group of scan lines HL1 to HLn, emission lines EL1 to Eln, data lines DL1 to DLm, a first voltage line PL, a second voltage line VL1, and a third voltage line VL2. The first group of scan lines SL1 to SLn, the second group of scan lines GL1 to GLn, the third group of scan lines HL1 to HLn, and the emission lines EL1 to Eln may extend in the first direction DR1 and may be arranged in a second direction DR2 crossing the first direction DR1. The data lines DL1 to DLm may insulatively cross the first group of scan lines SL1 to SLn, the second group of scan lines GL1 to GLn, the third group of scan lines HL1 to HLn, and the emission lines EL1 to Eln.

Each of the first voltage line PL, the second voltage line VL1, and the third voltage line VL2 may include at least one of a component extending in the first direction DR1 and a component extending in the second direction DR2. Each of the first voltage line PL, the second voltage line VL1, and the third voltage line VL2 may include a component extending in the first direction DR1 and a component extending in the second direction DR2. The structure and shape of the first voltage line PL, the second voltage line VL1, and the third voltage line VL2 may be designed independently of each other.

Each of the pixels PX may be electrically connected to corresponding signal lines among the aforementioned signal lines. A connection relationship between the pixels PX and the signal lines may be changed according to the configuration of the driving circuit of the pixels PX.

The first voltage line PL may receive the first power voltage ELVDD. A second power voltage ELVSS may be applied to the display panel DP. The second power voltage ELVSS may have a lower level than the first power voltage ELVDD.

The second voltage line VL1 may receive the first initialization voltage Vint. The first initialization voltage Vint may have a level lower than the first power voltage ELVDD. The third voltage line VL2 may receive the second initialization voltage VAint. The second initialization voltage Vint may have a lower level than the first power voltage ELVDD. The first initialization voltage Vint and the second initialization voltage VAint may be bias voltages having a constant level. The first initialization voltage Vint and the second initialization voltage VAint may have different levels. The second initialization voltage VAint may have a lower voltage than the first initialization voltage Vint.

The pixels PX may include multiple groups generating light of different colors. For example, the pixels PX may include red pixels generating red light, green pixels generating green light, and blue pixels generating blue light. The light emitting element of the red pixel, the light emitting element of the green pixel, and the light emitting element of the blue pixel may include light emitting layers formed of different materials. However, this is an example, and the embodiments are not limited thereto. For example, the light emitting element may include a light emitting layer formed of the same material, and light generated from the light emitting layer may pass through a color filter to generate red light, green light, and/or blue light.

FIG. 3 illustrates a pixel Pxij connected to the i-th scan line Sli of the first group among the scan lines SL1 to SLn of the first group, and connected to the j-th data line DLj among the data lines DL1 to DLm. The pixel Pxij may include a pixel driving circuit PC (hereinafter, a pixel circuit) and a light emitting element LD.

Referring to FIG. 3, the pixel circuit PC may include first to seventh transistors T1, T2, T3, T4, T5, T6, and T7 and a capacitor Cst. The first transistor T1, the second transistor T2, and the fifth to seventh transistors T5, T6, and T7 may be P-type transistors, and the third transistor T3 and the fourth transistor T4 may be N-type transistors. However, the disclosure is not limited thereto, and the first to seventh transistors T1, T2, T3, T4, T5, T6, and T7 may be implemented as either a P-type transistor or an N-type transistor.

Hereinafter, the input region (or input electrode) of the N-type transistor is described as a drain (or drain region), the input region of a P-type transistor is described as a source (or source region), the output region (or output electrode) of an N-type transistor is described as a source (or source region), and the output region of a P-type transistor is described as a drain (or drain region). Meanwhile, unlike illustrated, at least one of the first to seventh transistors T1, T2, T3, T4, T5, T6, and T7 may be omitted.

For example, the first transistor T1, the second transistor T2, and the fifth to seventh transistors T5, T6, and T7 may be silicon transistors. The third transistor T3 and the fourth transistor T4 may be oxide transistors.

The first transistor T1 may be a driving transistor, and the second transistor T2 may be a switching transistor. The capacitor Cst may be electrically connected between the first voltage line PL receiving the first power voltage ELVDD and the reference node RN. The capacitor Cst may include a first electrode CE10 electrically connected to the reference node RN and a second electrode CE20 electrically connected to the first voltage line PL.

The first transistor T1 may be electrically connected between the first voltage line PL and an electrode (e.g., an anode) of the light emitting element LD. The source S1 of the first transistor T1 may be electrically connected to the first voltage line PL. As used herein, "electrically connected between a transistor and a signal line or a transistor and a transistor" may mean "a transistor in which the source, drain, and gate have an integral shape with the signal line or are connected through a connection electrode". Another transistor may be disposed or omitted between the source S1 of the first transistor T1 and the first voltage line PL.

The drain D1 of the first transistor T1 may be electrically connected to the anode of the light emitting element LD. Another transistor may be disposed or omitted between the drain D1 of the first transistor T1 and the anode of the light emitting element LD. The gate G1 of the first transistor T1 may be electrically connected to the reference node RN.

The second transistor T2 may be electrically connected between the j-th data line DLj and the source S1 of the first transistor T1. The source S2 of the second transistor T2 may be electrically connected to the j-th data line DLj, and the drain D2 of the second transistor T2 may be electrically connected to the source S1 of the first transistor T1. The gate G2 of the second transistor T2 may be electrically connected to the i-th scan line Sli of the first group.

The third transistor T3 may be electrically connected between the reference node RN and the drain D1 of the first transistor T1. The drain D3 of the third transistor T3 may be electrically connected to the drain D1 of the first transistor T1, and the source S3 of the third transistor T3 may be electrically connected to the reference node RN. The gates G3-1 and G3-2 of the third transistor T3 may be electrically connected to the i-th scan line Gli of the second group.

The fourth transistor T4 may be electrically connected between the reference node RN and the second voltage line VL1. The drain D4 of the fourth transistor T4 may be electrically connected to the reference node RN, and the source S4 of the fourth transistor T4 may be electrically connected to the second voltage line VL1. The gates G4-1 and G4-2 of the fourth transistor T4 may be electrically connected to the i-th scan line Hli of the third group.

In FIG. 3, the third transistor T3 and the fourth transistor T4 are illustrated as including multiple gates, but the embodiments are not limited thereto. For example, at least one of the third transistor T3 and the fourth transistor T4 may include only one gate.

The fifth transistor T5 may be electrically connected between the first voltage line PL and the source S1 of the first transistor T1. The source S5 of the fifth transistor T5 may be electrically connected to the first voltage line PL, and the drain D5 of the fifth transistor T5 may be electrically connected to the source S1 of the first transistor T1. The gate G5 of the fifth transistor T5 may be electrically connected to the i-th emission line Eli.

The sixth transistor T6 may be electrically connected between the drain D1 of the first transistor T1 and the light emitting element LD. The source S6 of the sixth transistor T6 may be electrically connected to the drain D1 of the first transistor T1, and the drain D6 of the sixth transistor T6 may be electrically connected to the anode of the light emitting element LD. The gate G6 of the sixth transistor T6 may be electrically connected to the i-th emission line Eli. In another embodiment, the gate G6 of the sixth transistor T6 may be connected to a signal line different from the gate G5 of the fifth transistor T5.

The seventh transistor T7 may be electrically connected between the drain D6 of the sixth transistor T6 and the third voltage line VL2. The source S7 of the seventh transistor T7 may be electrically connected to the drain D6 of the sixth transistor T6, and the drain D7 of the seventh transistor T7 may be electrically connected to the third voltage line VL2. The gate G7 of the seventh transistor T7 may be electrically connected to the (i+1)-th scan line Sli+1 of the first group.

An operation of the pixel Pxij will be described in more detail with reference to FIGS. 3 and 4. The display device DD may display an image for each frame section. During each frame section, signal lines of each of the first group of scan lines SL1 to SLn, the second group of scan lines GL1 to GLn, the third group of scan lines HL1 to HLn, and the emission lines EL1 to Eln may be sequentially scanned. FIG. 4 shows a part of a frame section.

Referring to FIG. 4, each of the signals Emi, Gli, Gwi, Gci, and Gwi+1 may have a high level V-HIGH during some sections and a low level V-LOW during some sections. N-type transistors may be turned on in case that the corresponding signal has a high level V-HIGH, and P-type transistors may be turned on in case that a corresponding signal has a low level V-LOW.

In case that the emission control signal Emi has a high level V-HIGH, the fifth transistor T5 and the sixth transistor T6 may be turned off. In case that the fifth transistor T5 and the sixth transistor T6 are turned off, a current path may not be formed between the first voltage line PL and the light emitting element LD. Accordingly, the corresponding section may be defined as a non-emission section.

In case that the scan signal Gli applied to the i-th scan line Hli of the third group has a high level V-HIGH, the fourth transistor T4 may be turned on. In case that the fourth transistor T4 is turned on, the reference node RN may be initialized by the first initialization voltage Vint. In case that the scan signal Gwi applied to the i-th scan line Sli of the first group has a low level V-LOW and the scan signal Gci on the i-th scan line Gli of the second group has a high level V-HIGH, the second transistor T2 and the third transistor T3 may be turned on.

Since the reference node RN is initialized to the first initialization voltage Vint, the first transistor T1 may be in a turned-on state. In case that the first transistor T1 is turned on, a voltage corresponding to the data signal Dj (see FIG. 3) may be provided to the reference node RN. The capacitor Cst may store a voltage corresponding to the data signal Dj. The voltage corresponding to the data signal Dj may be a voltage reduced by the threshold voltage Vth of the first transistor T1 from the data signal Dj.

In case that the scan signal Gwi+1 applied to the (i+1)-th scan line Sli+1 of the first group has a low level V-LOW, the seventh transistor T7 may be turned on. As the seventh transistor T7 is turned on, the anode of the light emitting element LD may be initialized to the second initialization voltage VAint. A parasitic capacitor of the light emitting element LD may be discharged.

In case that the emission control signal Emi has a low level V-LOW, the fifth transistor T5 and the sixth transistor T6 may be turned on. In case that the fifth transistor T5 is turned on, a first power voltage ELVDD may be applied to the first transistor T1. In case that the sixth transistor T6 is turned on, the first transistor T1 and the light emitting element LD may be electrically connected to each other. The light emitting element LD may generate light having a luminance corresponding to the amount of received current.

Figure 5:
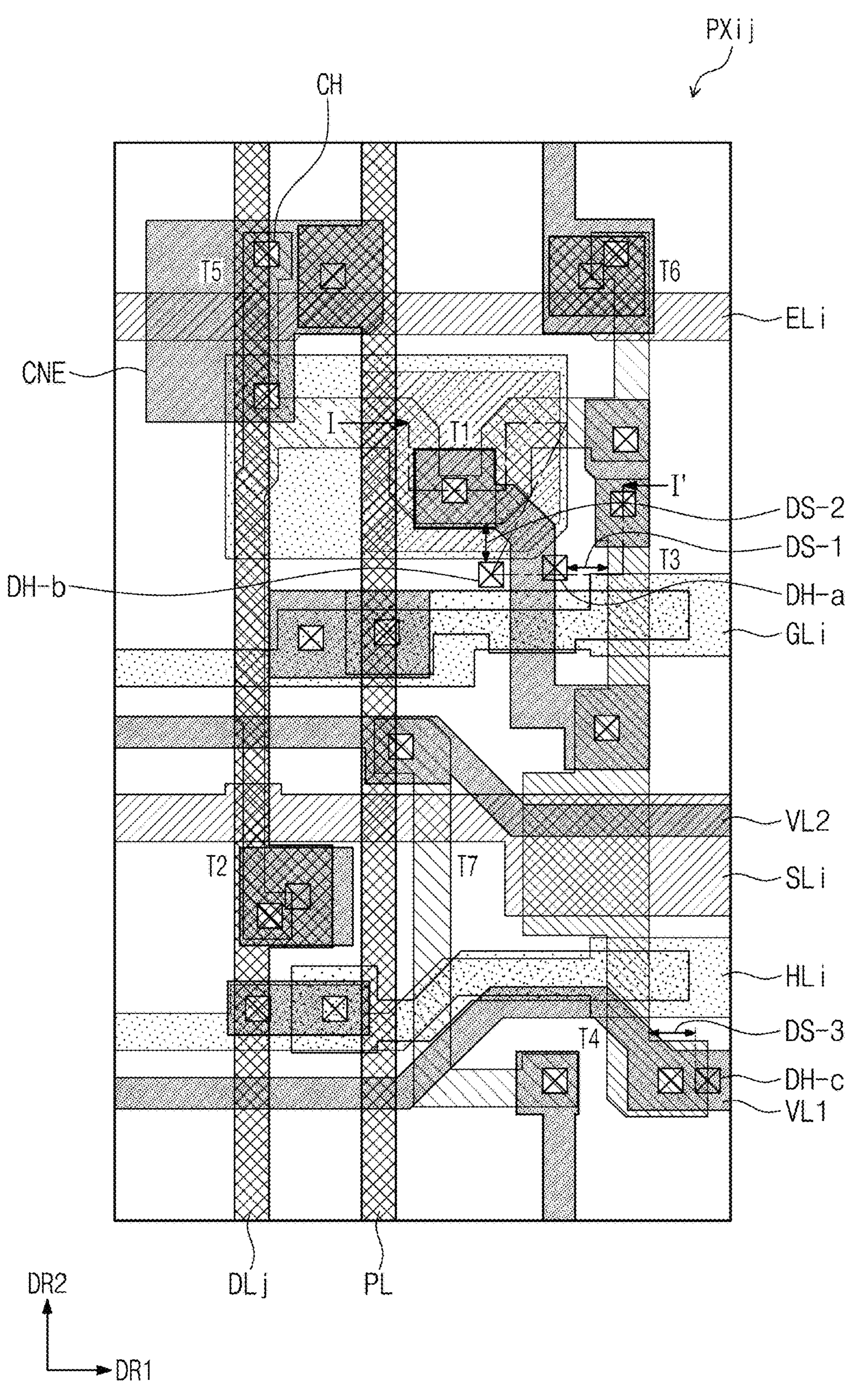
FIG. 5 is a schematic plan view illustrating a partial configuration of a pixel according to an embodiment.

FIG. 5 is a schematic plan view illustrating a partial configuration of the pixel Pxij, the contact hole CH, and the connection electrode CNE described with reference to FIG. 3. The contact hole CH and the connection electrode CNE may electrically connect the components of the pixel Pxij. The contact hole CH may include first to third contact holes CH1, CH2, and CH3 (see FIG. 7) to be described later.

Specifically, among the components of the pixel Pxij, the first to seventh transistors T1, T2, T3, T4, T5, T6, and T7, the i-th scan line Sli of the first group, the i-th emission line Eli of the second group, the i-th scan of the second group line Gli, the i-th scan line Hli of the third group, the first voltage line PL, the second voltage line VL1, the third voltage line VL2, and the j-th data line DLj are illustrated in FIG. 5. However, the connection relationship between the components of the pixel Pxij illustrated in FIG. 5 is an example only and is not limited to any one embodiment.

Referring to FIG. 5, dummy holes DH-a, DH-b, and DH-c may be formed adjacent to the first transistor T1, the third transistor T3, and the fourth transistor T4. The display panel DP according to an embodiment may have dummy holes DH-a, DH-b, and DH-c defined. In FIG. 5, the separation distance DS-1 between the dummy hole DH-a and the third transistor T3 may be about 10 μm or less. A separation distance DS-2 between the first transistor T1 and the adjacent dummy hole DH-b may be about 10 μm or less. A separation distance DS-3 between the fourth transistor T4 and the adjacent dummy hole DH-c may be about 10 μm or less. The dummy holes DH-a, DH-b, and DH-c may be formed to discharge hydrogen during a manufacturing stage of the display panel DP. The display panel DP of an embodiment in which the dummy holes DH-a, DH-b, and DH-c having a separation distance of about 10 μm or less from the transistors T1, T3, and T4 are formed may exhibit excellent reliability. The dummy hole will be described in more detail later with reference to FIG. 7.

Figure 6:
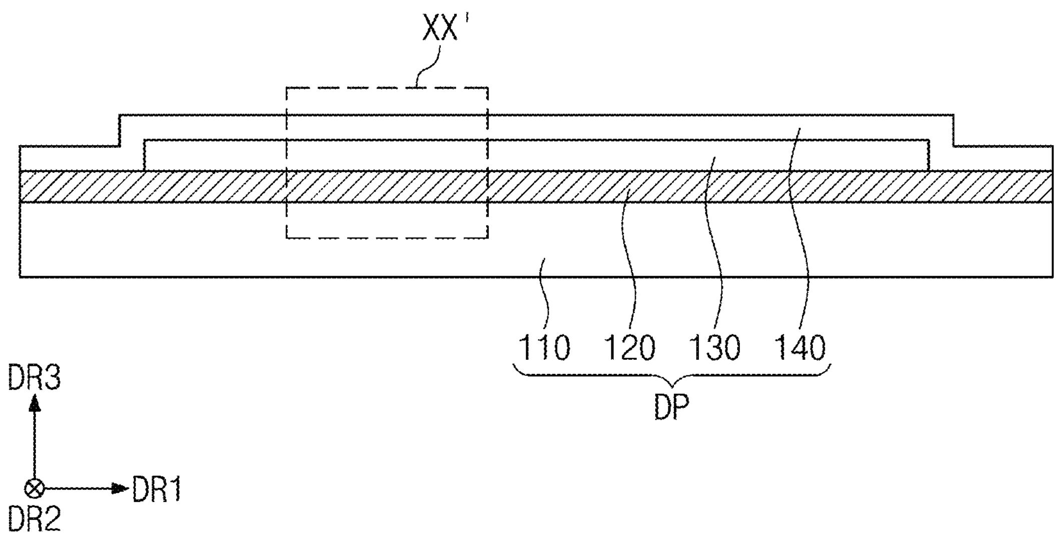
FIG. 6 is a schematic cross-sectional view illustrating a display panel according to an embodiment.

FIG. 6 is a schematic cross-sectional view illustrating a display panel according to an embodiment. Referring to FIG. 6, the display panel DP may include a base layer 110, a circuit layer 120, a light emitting element layer 130, and an encapsulation layer 140 that are sequentially stacked on each other. Unlike the illustration, a functional layer may be further disposed between adjacent two layers among the base layer 110, the circuit layer 120, the light emitting element layer 130, and the encapsulation layer 140.

The base layer 110 may provide a base surface on which the circuit layer 120 is disposed. The base layer 110 may be a flexible substrate. The base layer 110 may be a glass substrate, a metal substrate, and/or a polymer substrate. However, the embodiments are not limited thereto, and the base layer 110 may include an inorganic layer, an organic layer, or a composite material layer.

The base layer 110 may include a single layer or multiple layers. For example, the base layer 110 may include a first synthetic resin layer, a multi- or single-layer inorganic layer, and a second synthetic resin layer disposed on the multi- or single-layer inorganic layer. Each of the first synthetic resin layer and the second synthetic resin layer may include a polyimide-based resin. In addition, each of the first synthetic resin layer and the second synthetic resin layer may include at least one of acrylic resin, methacrylate resin, polyisoprene resin, vinyl resin, epoxy resin, urethane resin, cellulose resin, siloxane resin, polyamide resin, and perylene resin. In the present specification "~~"-based resin may mean to include a functional group of "~~".

The circuit layer 120 may be disposed on the base layer 110. The circuit layer 120 may include an insulating layer, a semiconductor pattern, a conductive pattern, and a signal line. The light emitting element layer 130 may be disposed on the circuit layer 120. The light emitting element layer 130 may include a light emitting element LD (see FIGS. 3 and 7). For example, the light emitting element LD (see FIGS. 3 and 7) may include an organic light emitting material, an inorganic light emitting material, an organic-inorganic light emitting material, a quantum dot, a quantum rod, a micro LED, or a nano LED.

The encapsulation layer 140 may be disposed on the light emitting element layer 130. The encapsulation layer 140 may protect the light emitting element layer 130 from foreign substances such as moisture, oxygen, and dust particles. The encapsulation layer 140 may include at least one inorganic layer. The encapsulation layer 140 may include a structure in which an inorganic layer, an organic layer, and an inorganic layer are sequentially stacked on each other.

Figure 7:
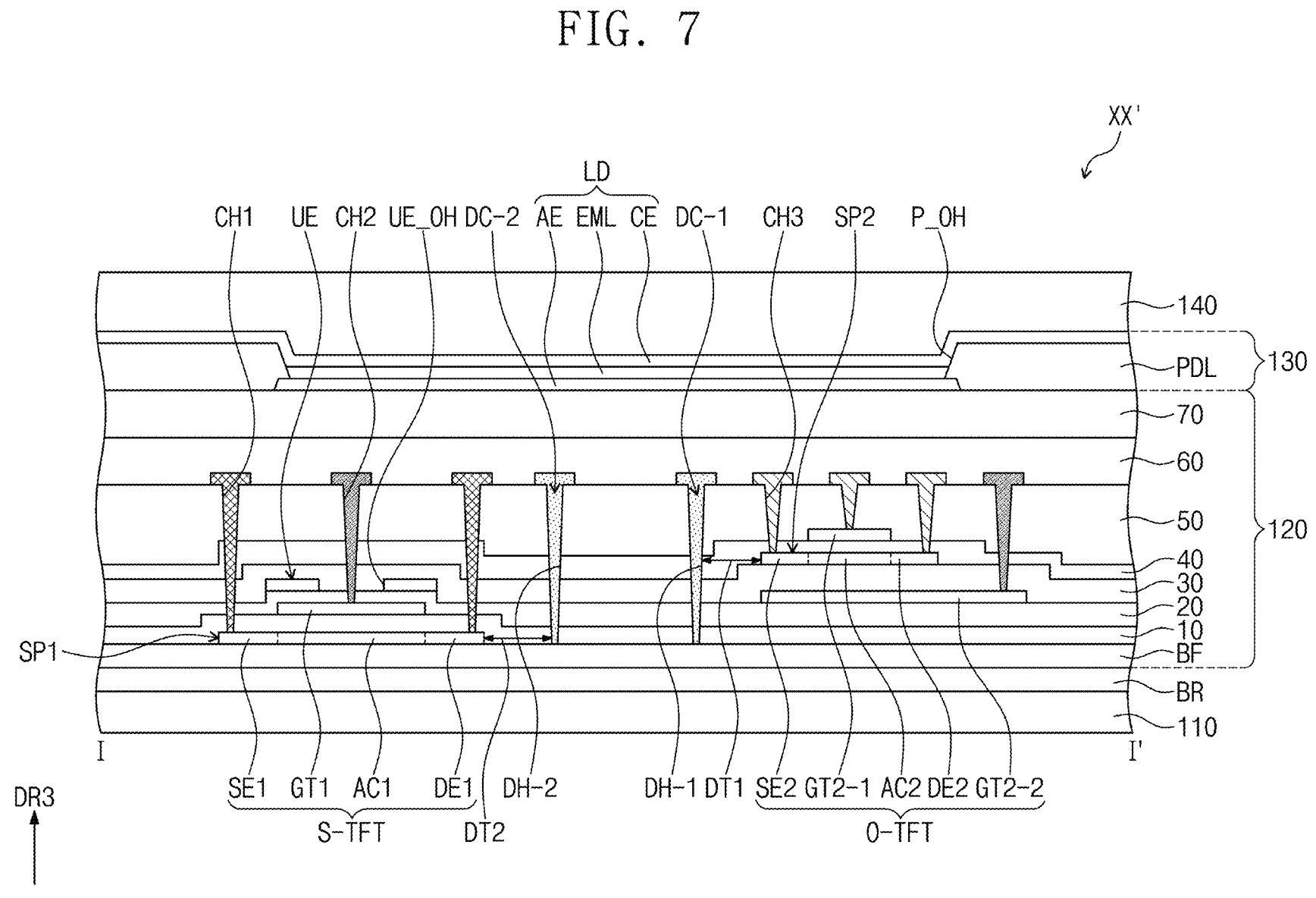

FIG. 7 is a schematic cross-sectional view illustrating a portion corresponding to region XX' of FIG. 6 and specifically illustrating the display panel DP according to an embodiment. FIG. 7 illustrates a silicon transistor S-TFT and an oxide transistor O-TFT of the light emitting element LD and the pixel circuit PC. Also, FIG. 7 may be a cross-sectional view illustrating a portion corresponding to the line II' of FIG. 5, in which contact holes CH1 and CH3 are additionally illustrated. In FIG. 5, the dummy hole DH-a adjacent to the third transistor T3 may correspond to the second dummy hole DH-2 of FIG. 7. In FIG. 5, the dummy hole DH-b adjacent to the first transistor T1 may correspond to the first dummy hole DH-1 of FIG. 7. The first dummy hole DH-1 and the second dummy hole DH-2 will be described in more detail later.

In the circuit diagram of FIG. 3, the third and fourth transistors T3 and T4 may be oxide transistors O-TFT, and the remaining transistors T1, T2, T5, T6, and T7 may be silicon transistors S-TFT. In another embodiment, the pixel circuit PC may include only one of a silicon transistor S-TFT and an oxide transistor O-TFT. Hereinafter, the silicon transistor S-TFT will be described as the first transistor T1 of FIG. 3, and the oxide transistor O-TFT will be described as the third transistor T3 of FIG. 3.

Referring to FIG. 7, the display panel DP may further include a barrier layer BR disposed on the base layer 110. The barrier layer BR may prevent foreign substances from being introduced from the outside. The barrier layer BR may include at least one inorganic layer. The barrier layer BR may include a silicon oxide layer and a silicon nitride layer. Each of the silicon oxide layer and the silicon nitride layer may be provided in plurality, and the silicon oxide layers and the silicon nitride layers may be alternately stacked on each other.

A buffer layer BF may be disposed on the barrier layer BR. The buffer layer BF may prevent diffusion of metal atoms or impurities from the base layer 110 to the upper first semiconductor pattern SP1. The buffer layer BF may include at least one inorganic layer. The buffer layer BF may include a silicon oxide layer and/or a silicon nitride layer.

A first semiconductor pattern SP1 may be disposed on the buffer layer BF. The first semiconductor pattern SP1 may include a silicon semiconductor pattern. For example, the silicon semiconductor pattern may include amorphous silicon, polycrystalline silicon, and/or the like. More specifically, the first semiconductor pattern SP1 may include low-temperature polysilicon.

FIG. 7 illustrates a portion of the first semiconductor pattern SP1, and the first semiconductor pattern SP1 may be further disposed in another region. The first semiconductor pattern SP1 may have different electrical properties depending on whether it is doped or not. The first semiconductor pattern SP1 may include a first portion having high conductivity and a second portion having low conductivity. The first portion may be doped with an N-type dopant or a P-type dopant. The P-type transistor may include a doped portion doped with a P-type dopant, and the N-type transistor may include a doped portion doped with an N-type dopant. The second portion may be an undoped portion or a portion doped at a lower concentration than the first portion.

The conductivity of the first portion may be greater than that of the second portion, and the first portion may substantially serve as an electrode or a signal line. The second portion may substantially correspond to a channel region (or an active region) of the transistor. For example, a portion of the first semiconductor pattern SP1 may be a channel of the transistor, another portion may be a source or drain of the transistor, and another portion may be a connection electrode or a connection signal line.

The first source region SE1, the first channel region AC1 or active region, and the first drain region DE1 of the silicon transistor S-TFT may be formed from the first semiconductor pattern SP1. The first source region SE1 and the first drain region DE1 may extend in opposite directions from the first channel region AC1 in a cross-section view. The first source region SE1 and the first drain region DE1 may be electrically connected to the corresponding signal line and the light emitting element LD through the first contact hole CHL The first insulating layer 10 may be disposed on the buffer layer BF. The first insulating layer 10 may cover the first semiconductor pattern SP1. The first insulating layer 10 may be an inorganic layer. The first insulating layer 10 may include at least one of aluminum oxide, titanium oxide, silicon oxide, silicon nitride, silicon oxynitride, zirconium oxide, and hafnium oxide. The first insulating layer 10 may be a single layer of silicon oxide. Each of the first insulating layer 10 and the second to fifth insulating layers 20, 30, 40, and 50 to be described later may have a single-layer or multi-layer structure, and may include at least one of the above-described materials.

A gate GT1 (hereinafter, referred to as a first gate) of the silicon transistor S-TFT may be disposed on the first insulating layer 10. The first gate GT1 may be electrically connected to a corresponding signal line through the second contact hole CH2. The first gate GT1 may be a part of the metal pattern. The first gate GT1 may overlap the first channel region AC1. In the process of doping the first semiconductor pattern SP1, the first gate GT1 may be a mask. The first gate GT1 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), alloys containing titanium, tantalum (Ta), platinum (Pt), scandium (Sc), and/or the like. For example, the first gate GT1 may include an aluminum layer and a titanium layer disposed on the aluminum layer. Since the first gate GT1 including the aluminum layer and the titanium layer has a relatively low resistance, the driving speed may be improved.

The second insulating layer 20 is disposed on the first insulating layer 10, and the second insulating layer 20 may cover the first gate GT1. An upper electrode UE overlapping the first gate GT1 may be disposed on the second insulating layer 20. The upper electrode UE may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), alloys containing titanium, tantalum (Ta), platinum (Pt), scandium (Sc), and/or the like. For example, the upper electrode UE may include an aluminum layer and a titanium layer disposed on the aluminum layer.

An opening UE_OH may be defined in the upper electrode UE. The opening UE_OH of the upper electrode UE may overlap the first gate GT1 of the silicon transistor S-TFT.

A third gate GT2-2 may be disposed on the second insulating layer 20. In case that the oxide transistor O-TFT includes two gates, the third gate GT2-2 may be a gate disposed below the oxide transistor O-TFT. In another embodiment, in case that the oxide transistor O-TFT includes one gate, the third gate GT2-2 may be a shielding electrode.

A third insulating layer 30 may be disposed on the second insulating layer 20. The second semiconductor pattern SP2 may be disposed on the third insulating layer 30. The second semiconductor pattern SP2 may include a channel region AC2 of the oxide transistor O-TFT. The second semiconductor pattern SP2 may include an oxide semiconductor pattern. The second semiconductor pattern SP2 may include a transparent conductive oxide TCO such as indium tin oxide (ITO), indium zinc oxide (IZO), indium gallium zinc oxide (IGZO), indium tin zinc oxide (ITZO), indium tin gallium oxide (ITGO), indium gallium tin zinc oxide (IGTZO), zinc oxide (ZnOx), and/or indium oxide ($In_2O_3$). The zinc oxide (ZnOx) may be zinc oxide (ZnO) and/or zinc peroxide ($ZnO_2$).

The oxide semiconductor may include multiple regions divided according to whether the transparent conductive oxide is reduced. A region in which the transparent conductive oxide is reduced (hereinafter, a reduced region) may have greater conductivity than a region in which the transparent conductive oxide is not reduced (hereinafter, a non-reduced region). The reduction region may effectively serve as the source/drain or signal line of the transistor. The non-reduced region may substantially correspond to the semiconductor region (or channel) of the transistor. For example, a portion of the second semiconductor pattern SP2 may be a semiconductor region of the transistor, another portion may be a source region/drain region of the transistor, and another portion may be a signal transmission region.

A fourth insulating layer 40 may be disposed on the third insulating layer 30. The fourth insulating layer 40 may cover the second semiconductor pattern SP2. A gate GT2-1 (hereinafter, referred to as a second gate) of the oxide transistor O-TFT may be disposed on the fourth insulating layer 40. The oxide transistor O-TFT may include two gates, and the two gates may be a third gate GT2-2 on an upper side of the second insulating layer 20 and a second gate GT2-1 disposed on an upper side of the fourth insulating layer 40. The third gate GT2-2 disposed on the second insulating layer 20 and the second gate GT2-1 disposed on the fourth insulating layer 40 may be electrically connected to each other. However, the embodiments are not limited thereto, and the oxide transistor O-TFT may include one gate.

The second source region SE2, the second channel region AC2 or active region, and the second drain region DE2 of the oxide transistor O-TFT may be formed from the second semiconductor pattern SP2. The second source region SE2 and the second drain region DE2 may extend in opposite directions from the second channel region AC2 in a cross-section view. The first source region SE1 and the first drain region DE1 may be electrically connected to the corresponding signal line and the light emitting element LD through the first contact hole CHL The second gate GT2-1 of the oxide transistor O-TFT may be a part of the metal pattern. The second gate GT2-1 of the oxide transistor O-TFT may overlap the second channel region AC2. The second gate GT2-1 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), alloys containing titanium, tantalum (Ta), platinum (Pt), scandium (Sc), and/or the like. For example, the second gate GT2-1 may include a titanium layer, an aluminum layer, and a titanium layer sequentially stacked on each other. Since the second gate GT2-1 including the aluminum layer and the titanium layer has a relatively low resistance, the driving speed may be improved.

A fifth insulating layer 50 may be disposed above the fourth insulating layer 40, and the fifth insulating layer 50 may cover the second gate GT2-1. Each of the first insulating layer 10 to the fifth insulating layer 50 may be an inorganic layer.

The sixth insulating layer 60 may be disposed on the fifth insulating layer 50, and the seventh insulating layer 70 may be disposed on the sixth insulating layer 60. The sixth insulating layer 60 and the seventh insulating layer 70 may be organic layers. For example, each of the sixth insulating layer 60 and the seventh insulating layer 70 may include Benzocyclobutene (BCB), polyimide, Hexamethyldisiloxane (HMDSO), Polymethylmethacrylate (PMMA), or general purpose polymers such as polystyrene (PS), polymer derivatives having phenolic groups, acrylic polymers, imide-based polymers, arylether-based polymers, amide-based polymers, fluorine-based polymers, p-xylene-based polymers, vinyl alcohol-based polymers, blends thereof, and the like.

The light emitting element LD may include a first electrode AE, a light emitting layer EML disposed above the first electrode AE, and a second electrode CE disposed above the light emitting layer EML. The first electrode AE may be disposed on the seventh insulating layer 70.

The first electrode AE may be an anode. The first electrode AE may be a transparent electrode, a semi-transparent electrode, or a reflective electrode. The first electrode AE may include a reflective layer formed of silver (Ag), magnesium (Mg), aluminum (Al), platinum (Pt), lead (Pd), gold (Au), nickel (Ni), neodymium (Nd), iridium (Ir), chromium (Cr)), and/or a compound thereof, and a transparent or semi-transparent electrode layer formed on the reflective layer. The transparent or translucent electrode layer may include at least one selected from the group consisting of indium tin oxide (ITO), indium zinc oxide (IZO), indium gallium zinc oxide (IGZO), zinc oxide (ZnOx) or indium oxide ($In2O_3$), and aluminum doped zinc oxide (AZO). For example, the first electrode AE may include a stacked structure of ITO/Ag/ITO.

A pixel defining film PDL may be disposed on the seventh insulating layer 70. The pixel defining film PDL may have a transparent property or a light absorbing property. For example, the pixel defining film PDL that absorbs light may include a black coloring agent. The black coloring agent may include a black dye and a black pigment. The black coloring agent may include a metal such as carbon black or chromium, or an oxide thereof. The pixel defining film PDL may correspond to a light blocking pattern having light blocking characteristics.

The pixel defining film PDL may cover a portion of the first electrode AE. For example, a pixel opening P_OH exposing a portion of the first electrode AE may be defined in the pixel defining film PDL. The pixel defining film PDL may increase the distance between the edge of the first electrode AE and the second electrode CE. Accordingly, it may be possible to prevent an arc from occurring at the edge of the first electrode AE by the pixel defining film PDL.

The light emitting layer EML may include an organic light emitting material, an inorganic light emitting material, an organic-inorganic light emitting material, a quantum dot, a quantum rod, a micro LED, and/or a nano LED. Although not shown in the drawing, a hole control layer may be disposed between the first electrode AE and the light emitting layer EML. The hole control layer may include at least one of a hole injection layer, a hole transport layer, and an electron blocking layer. An electron control layer may be disposed between the light emitting layer EML and the second electrode CE. The electron control layer may include at least one of an electron injection layer, an electron transport layer, and a hole blocking layer.

The second electrode CE may be a cathode electrode. The second electrode CE may be disposed as a common layer. The second electrode CE may be referred to as a common electrode. For example, the second electrode CE may include at least one selected from Ag, Mg, Cu, Al, Pt, Pd, Au, Ni, Nd, Jr, Cr, Li, Ca, LiF, Mo, Ti, W, In, Sn, and Zn, two or more compounds selected therefrom, a mixture of two or more selected therefrom, and/or oxides thereof.

In an embodiment, a first dummy hole DH-1 passing through the first contact insulating layers in contact with the oxide transistor O-TFT may be defined. For example, based on the thickness direction DR3, the first contact insulating layers may be in contact with an upper side of the oxide transistor O-TFT. The first contact insulating layers may include a fourth insulating layer 40 and a fifth insulating layer 50. The fifth insulating layer 50 may be in contact with the oxide transistor O-TFT on the upper side of the second gate GT2-1. The fourth insulating layer 40 may be disposed between the second semiconductor pattern SP2 and the second gate GT2-1 to contact the second semiconductor pattern SP2 and the second gate GT2-1. The first dummy hole DH-1 may pass through at least the fourth insulating layer 40 and the fifth insulating layer 50. The first dummy hole DH-1 may penetrate the fourth insulating layer 40 and the fifth insulating layer 50, and may further penetrate at least one insulating layer disposed below the fourth insulating layer 40.

In an embodiment, the first dummy hole DH-1 may be spaced apart from the oxide transistor O-TFT. The first separation distance DT1 between the first dummy hole DH-1 and the second semiconductor pattern SP2 may be greater than 0 μm and less than or equal to 10 μm. For example, the first separation distance DT1 may be about 3.4 um or more and about 7.4 um or less. However, this is an example, and the embodiments are not limited thereto.

The first separation distance DT1 between the first dummy hole DH-1 and the second semiconductor pattern SP2 may be a linear distance in a direction perpendicular to the thickness direction DR3. The first separation distance DT1 between the first dummy hole DH-1 and the second semiconductor pattern SP2 may be the distance from the edge of the second semiconductor pattern SP2 to the first dummy hole DH-1. A first separation distance DT1 between the first dummy hole DH-1 and the second semiconductor pattern SP2 may be a distance on a plane on which the fourth insulating layer 40 in contact with the second semiconductor pattern SP2 and the second gate GT2-1 is disposed.

In FIG. 7, a separation distance from the second source region SE2 of the oxide transistor O-TFT to the first dummy hole DH-1 is illustrated as a first separation distance DT1. However, this is only an example, and the position of the first dummy hole DH-1 is not limited to the illustrated position. In a direction perpendicular to the thickness direction DR3, the first dummy hole DH-1 may be formed at a position spaced apart from the edge of the second semiconductor pattern SP2 by about 10 μm or less. The first dummy hole DH-1 may be used as a passage for discharging hydrogen during the manufacturing process of the display panel.

The dummy hole formed at a position spaced apart from the edge of the second semiconductor pattern SP2 by more than about 10 μm may exhibit a characteristic that hydrogen is not readily discharged during the manufacturing process of the display panel. Hydrogen that is not discharged may cause the threshold voltage Vth of the oxide transistor to be negative. In an embodiment, the display panel DP in which the first dummy hole DH-1 is formed at a position spaced apart from the edge of the second semiconductor pattern SP2 by about 10 μm or less may have improved hydrogen emission reliability. Accordingly, the threshold voltage of the oxide transistor O-TFT may be prevented from being negative, and the reliability of the display panel DP may be improved.

Referring to FIG. 7, the first dummy hole DH-1 may overlap the light emitting element LD. Since the light emitting element LD is disposed in the display area DP-AA of FIG. 1, the first dummy hole DH-1 may overlap the display area DP-AA of FIG. 1. A first dummy conductive pattern DC-1 may be disposed in the first dummy hole DH-1. For example, the first dummy hole DH-1 may be filled with a metal material. Although one first dummy hole DH-1 is illustrated in FIG. 7, the number of the first dummy holes DH-1 is not limited thereto, and multiple first dummy holes may be formed.

The first dummy hole DH-1 may further penetrate the third insulating layer 30, the second insulating layer 20 disposed below the third insulating layer 30, and the first insulating layer 10. The first dummy hole DH-1 passing through the first insulating layer 10 may expose the upper surface of the buffer layer BF. Meanwhile, unlike shown in FIG. 7, the first dummy hole DH-1 may pass through only a portion of the first insulating layer 10 and may be formed to be spaced apart from the buffer layer BF by a determined or selected distance in the thickness direction DR3.

In an embodiment, a second dummy hole DH-2 passing through the second contact insulating layers in contact with the silicon transistor S-TFT may be defined. For example, based on the thickness direction DR3, the second contact insulating layers may be in contact with the upper side of the silicon transistor S-TFT. Referring to FIG. 7, the second contact insulating layers may include a first insulating layer 10 and a second insulating layer 20. The first insulating layer 10 may be disposed between the first semiconductor pattern SP1 and the first gate GT1 to contact the first semiconductor pattern SP1 and the first gate GT1. The second insulating layer 20 may contact the silicon transistor S-TFT on the upper side of the first gate GT1. The second dummy hole DH-2 may pass through at least the first insulating layer 10 and the second insulating layer 20. The second dummy hole DH-2 may penetrate the first insulating layer 10 and the second insulating layer 20 and further penetrate at least one insulating layer disposed above the second insulating layer 20.

In an embodiment, the second dummy hole DH-2 may be spaced apart from the silicon transistor S-TFT. A second separation distance DT2 between the second dummy hole DH-2 and the first semiconductor pattern SP1 included in the silicon transistor S-TFT may be greater than 0 um and less than or equal to 10 um.

The second separation distance DT2 between the second dummy hole DH-2 and the first semiconductor pattern SP1 may be a linear distance in a direction perpendicular to the thickness direction DR3. The second separation distance DT2 between the second dummy hole DH-2 and the first semiconductor pattern SP1 may be a linear distance from the edge of the first semiconductor pattern SP1 to the second dummy hole DH-2. A second separation distance DT2 between the second dummy hole DH-2 and the first semiconductor pattern SP1 may be a distance on a plane on which the first insulating layer 10 in contact with the first semiconductor pattern SP1 and the first gate GT1 is disposed.

In FIG. 7, a separation distance from the first drain region DE1 of the silicon transistor S-TFT to the second dummy hole DH-2 is illustrated as a second separation distance DT2. However, this is only an example, and the formation position of the second dummy hole DH-2 is not limited thereto. In a direction perpendicular to the thickness direction DR3, the second dummy hole DH-2 may be formed at a position spaced apart from the edge of the first semiconductor pattern SP1 by about 10 μm or less.

The dummy hole formed at a position spaced apart from the edge of the first semiconductor pattern SP1 by more than about 10 μm may exhibit a characteristic that hydrogen is not readily discharged during the manufacturing process of the display panel. In addition, the display panel in which the dummy hole is not formed may contain unnecessary hydrogen. Hydrogen that is not discharged may degrade the driving of the silicon transistor. In an embodiment, the display panel DP in which the second dummy hole DH-2 is formed at a position spaced apart by about 10 μm or less from the edge of the first semiconductor pattern SP1 may have improved hydrogen emission reliability. Accordingly, deterioration in driving of the silicon transistor S-TFT may be prevented, and reliability of the display panel DP may be improved.

Referring to FIG. 7, the second dummy hole DH-2 may overlap the light emitting element LD. Since the light emitting element LD is disposed in the display area DP-AA (see FIG. 1), the first dummy hole DH-2 may overlap the display area DP-AA (see FIG. 2). Although one second dummy hole DH-2 is illustrated in FIG. 7, the number of the second dummy holes DH-2 is not limited thereto, and multiple second dummy holes may be formed.

A second dummy conductive pattern DC-2 may be disposed in the second dummy hole DH-2. For example, a metal material may be provided in the second dummy hole DH-2. The first dummy conductive pattern DC-1 disposed in the first dummy hole DH-1 and the second dummy conductive pattern DC-2 disposed in the second dummy hole DH-2 may include the same metal material.

The second dummy hole DH-2 may penetrate the third to fifth insulating layers 30, 40, and 50. The second dummy hole DH-2 may be formed in the same step as the first dummy hole DH-1. Accordingly, the third to fifth insulating layers 30, 40, and 50 through which the first dummy hole DH-1 passes may be formed such that the second dummy hole DH-2 penetrates therethrough.

The second dummy hole DH-2 passing through the first insulating layer 10 may expose the upper surface of the buffer layer BF. Meanwhile, unlike illustrated, the second dummy hole DH-2 may pass through only a portion of the first insulating layer 10 and may be formed to be spaced apart from the buffer layer BF by a predetermined distance in the thickness direction DR3.

The contents of the first dummy hole DH-1 described with reference to FIG. 7 may be equally applied to the dummy holes DH-a and DH-c illustrated in FIG. 5. Also, the contents of the second dummy hole DH-2 described with reference to FIG. 7 may be equally applied to the dummy hole DH-b illustrated in FIG. 5.

Figure 8:
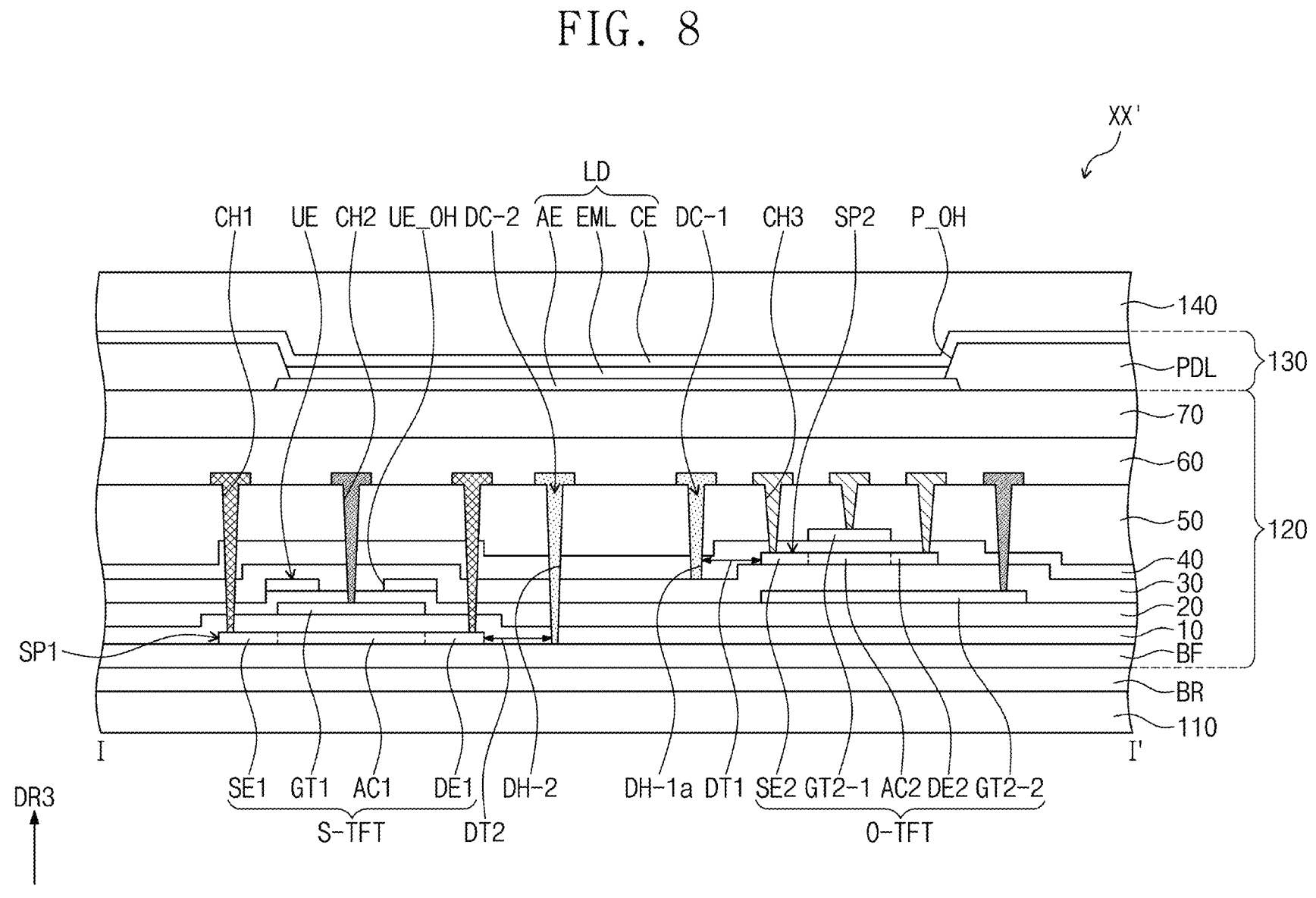

FIG. 8 is a schematic cross-sectional view showing another embodiment of the disclosure, and compared with FIG. 7, there may be a difference at least in the first contact insulating layer through which the first dummy hole DH-la passes. In the description of FIG. 8, content overlapping with the content described with reference to FIGS. 1 to 7 will not be described again, and differences will be described.

Referring to FIG. 8, the first dummy hole DH-1*a* may pass through the fourth insulating layer 40 and the fifth insulating layer 50. The first dummy hole DH-la illustrated in FIG. 8 may not penetrate the first to third insulating layers 10, 20, and 30. The first contact insulating layer may include the fourth insulating layer 40 and the fifth insulating layer 50, and may not include the first to third insulating layers 10, 20, and 30.

The first dummy hole DH-la may pass through the fourth insulating layer 40 and the fifth insulating layer 50, and the second dummy hole DH-2 may pass through the first to fifth insulating layers 10, 20, 30, 40, and 50. In the method of manufacturing a display panel according to an embodiment to be described later, the first dummy hole DH-1*a* may be formed to pass through the fourth insulating layer 40 and the fifth insulating layer 50 without penetrating the first to third insulating layers 10, 20, and 30.

Figure 9:
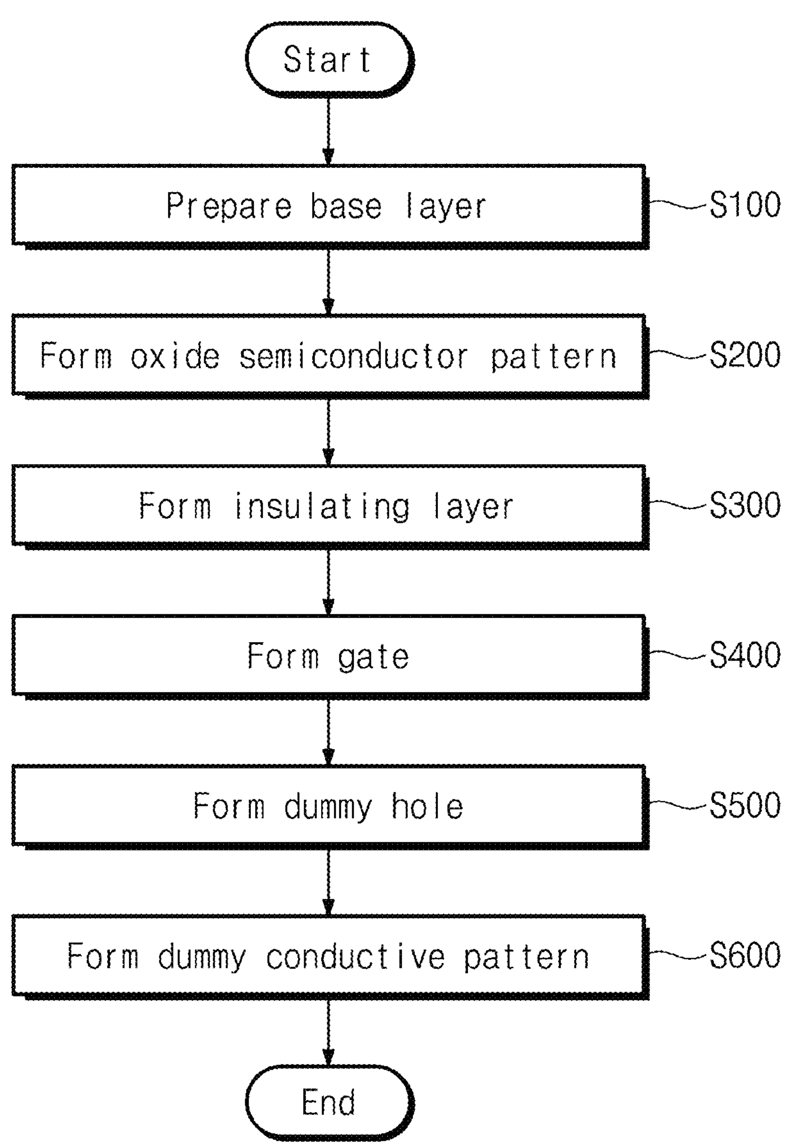
FIG. 9 is a schematic flowchart illustrating a method of manufacturing a display panel according to an embodiment.

The display panel according to an embodiment may be formed by the method of manufacturing the display panel according to an embodiment. FIG. 9 is a schematic flowchart illustrating a method of manufacturing a display panel according to an embodiment. FIGS. 10 to 14 schematically illustrate manufacturing steps of a display panel according to an embodiment. Hereinafter, in the description of a method of manufacturing a display panel according to an embodiment described with reference to FIGS. 9 to 14, the content overlapping with the content described with reference to FIGS. 1 to 8 will not be described again, and differences will be described.

Referring to FIG. 9, a method of manufacturing a display panel according to an embodiment may include preparing the base layer in operation S100, forming an oxide semiconductor pattern on the upper side of the base layer in operation S200, forming a fourth insulating layer directly disposed on the upper side of the oxide semiconductor pattern in operation S300, forming a second gate directly disposed on the fourth insulating layer in operation S400, forming a first dummy hole in operation S500, and providing a metal material in the first dummy hole to form a first dummy conductive pattern in operation S600. The first dummy hole DH-1 (see FIG. 7) may be formed to be spaced apart from the oxide semiconductor pattern (i.e., the second semiconductor pattern SP2) and the second gate GT2-1 disposed above the oxide semiconductor pattern SP2. An oxide transistor O-TFT may be formed from the operation of forming the oxide semiconductor pattern SP2 and the second gate GT2-1.

Figure 10:
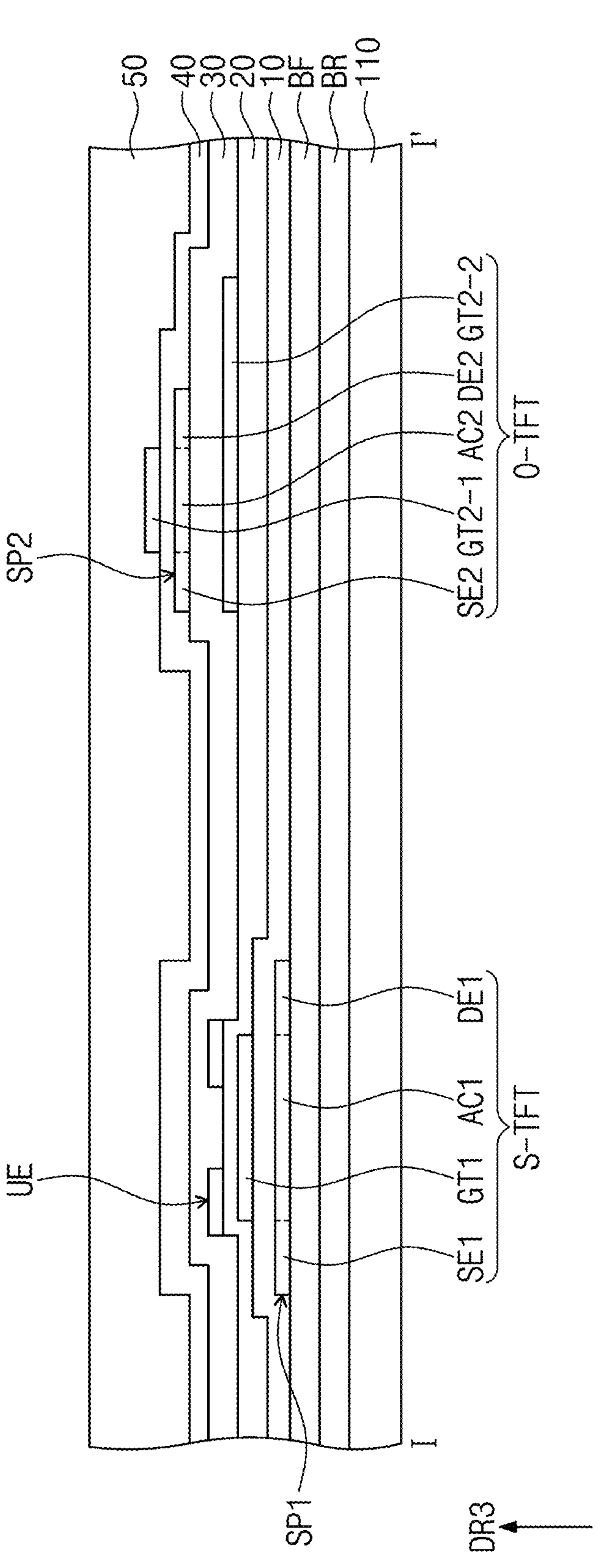
FIG. 10 schematically illustrates a manufacturing step of a display panel according to an embodiment.

Referring to FIG. 10, before the oxide transistor O-TFT is formed, a silicon transistor S-TFT may be formed. A method of manufacturing a display panel according to an embodiment may further include forming a buffer layer BF on the upper side of the base layer 110 before forming the oxide semiconductor pattern in operation S200, forming a silicon semiconductor pattern (i.e., the first semiconductor pattern SP1) on the buffer layer BF, forming the first insulating layer 10 on the silicon semiconductor pattern SP1, and forming the first gate GT1 on the first insulating layer 10. The first insulating layer 10 may be directly formed on the first semiconductor pattern SP1, and the first gate GT1 may be directly formed on the first insulating layer 10.

After the forming of the first gate GT1, the second insulating layer 20, the upper electrode UE, and the third insulating layer 30 may be sequentially formed. In the forming of the upper electrode UE, a third gate GT2-2 of the oxide transistor O-TFT may be formed. After the third insulating layer 30 is formed, a second semiconductor pattern SP2 may be formed. After forming the second gate GT2-1 of the oxide transistor O-TFT, the fifth insulating layer 50 may be formed.

Figure 11:
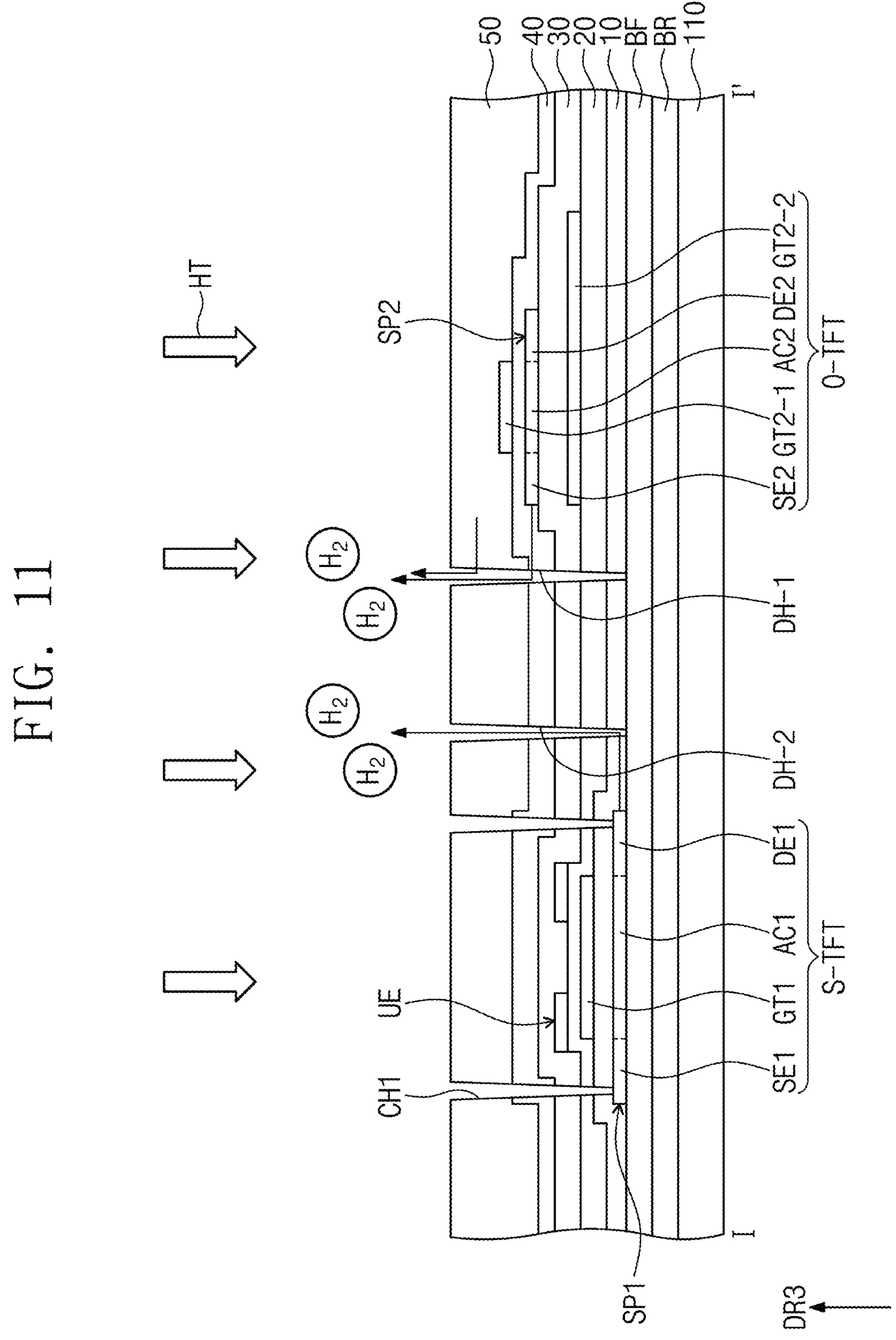
FIG. 11 schematically illustrates a manufacturing step of a display panel according to an embodiment.

FIG. 11 shows forming the first dummy hole in operation S500. The first dummy hole DH-1 may be formed to pass through the fourth insulating layer 40 and the fifth insulating layer 50. As described above, the fourth insulating layer 40 and the fifth insulating layer 50 may be insulating layers in contact with the second semiconductor pattern SP2 and/or the second gate GT2-1. In addition, the first dummy hole DH-1 may further penetrate the first to third insulating layers 10, 20, and 30 disposed below the fourth insulating layer 40. In the method of manufacturing the display panel according to an embodiment, after the silicon transistor S-TFT and the oxide transistor O-TFT are formed, the first dummy hole DH-1 may be formed. Accordingly, the first dummy hole DH-1 may be formed to penetrate the first to third insulating layers 10, 20, and 30 formed before the oxide transistor O-TFT is formed.

On the other hand, the first dummy hole DH-1*a* (see FIG. 8) may be formed so as to penetrate the fourth insulating layer 40 and the fifth insulating layer 50, and the first dummy hole DH-la may be formed relative to the first to third insulating layers 10, 20, and 30 so as not to penetrate therethrough. For example, a mask may be provided to form a first dummy hole DH-la (see FIG. 8) passing through the fourth insulating layer 40 and the fifth insulating layer 50 and not passing through the first to third insulating layers 10, 20, and 30. However, this is an example, and the method of forming the first dummy hole DH-la (see FIG. 8) is not limited thereto.

A first contact hole CH1 may be formed such that the silicon semiconductor pattern SP1 may be electrically connected to a corresponding signal line and/or a light emitting element. In the operation of forming the first contact hole CH1, a first dummy hole DH-1 may be formed. The first dummy hole DH-1 and the first contact hole CH1 may be formed in the same operation. For example, the first dummy hole DH-1 and the first contact hole CH1 may be simultaneously etched.

The first contact hole CH1 may be formed to penetrate the second to fifth insulating layers 20, 30, 40, and 50 disposed above the silicon semiconductor pattern SP1. The first contact hole CH1 may be electrically connected to the first source region SE1 and the first drain region DE1.

The first dummy hole DH-1 may be formed at a position where a separation distance from the edge of the second semiconductor pattern SP2 is about 10 μm or less. The forming of the first dummy hole DH-1 may include etching an insulating layer in contact with the oxide transistor O-TFT and providing heat to the etched region. An etching process may be performed to form a first dummy hole DH-1 penetrating the first to fifth insulating layers 10, 20, 30, 40, and 50. Heat HT may be provided to the etched area. As heat HT is provided, hydrogen may be discharged through the first dummy hole DH-1.

The heat HT may be provided at a temperature of about 370° C. or higher and about 390° C. or lower. As heat HT is provided at a temperature of about 370° C. or higher and about 390° C. or lower, hydrogen $H_2$ may be discharged. In case that hydrogen is not discharged, the hydrogen shifts the threshold voltage of the oxide transistor to a negative value, thereby deteriorating the reliability of the display panel.

In case that heat is provided at a temperature of less than about 370° C., it may be difficult to discharge hydrogen, and in case that heat is provided at a temperature higher than about 390° C., members constituting the display panel are damaged. The method of manufacturing a display panel according to an embodiment including the operation of providing heat at a temperature of about 370° C. or higher and about 390° C. or lower in the forming of the first dummy hole DH-1 may exhibit excellent manufacturing reliability. The display panel according to an embodiment manufactured by the method of manufacturing the display panel according to an embodiment may exhibit excellent reliability.

In an embodiment, the second dummy hole DH-2 may be formed in the same step as the first dummy hole DH-1. The second dummy hole DH-2 may be formed to be spaced apart from the first semiconductor pattern SP1 and the first gate GT1. The second dummy hole DH-2 may be formed to pass through the first insulating layer 10 and the second insulating layer 20 in contact with the silicon transistor S-TFT. Also, the second dummy hole DH-2 may be formed to penetrate the third to fifth insulating layers 30, 40, and 50 in contact with the oxide transistor O-TFT at upper and lower sides. An etching process may be performed to penetrate the first to fifth insulating layers 10, 20, 30, 40, and 50 to form a second dummy hole DH-2. After the etching process, heat HT may be provided, and hydrogen may be discharged through the second dummy hole DH-2.

The heat HT may be provided at a temperature of about 370° C. or higher and about 390° C. or lower. As heat HT is provided at a temperature of about 370° C. or higher and about 390° C. or lower, hydrogen $H_2$ may be discharged. In case that hydrogen is not discharged, the hydrogen may degrade the driving of the silicon transistor. The method of manufacturing a display panel according to an embodiment including the operation of providing heat at a temperature of about 370° C. or higher and about 390° C. or lower in the forming of the second dummy hole DH-2 may exhibit excellent manufacturing reliability. The display panel according to an embodiment manufactured by the method of manufacturing the display panel according to an embodiment may exhibit excellent reliability.

After discharging the hydrogen by providing heat HT, a cleaning operation may be performed. After the operation of forming the first contact hole CH1, the first dummy hole DH-1, and the second dummy hole DH-2, a cleaning solution or the like may be provided.

Figure 12:
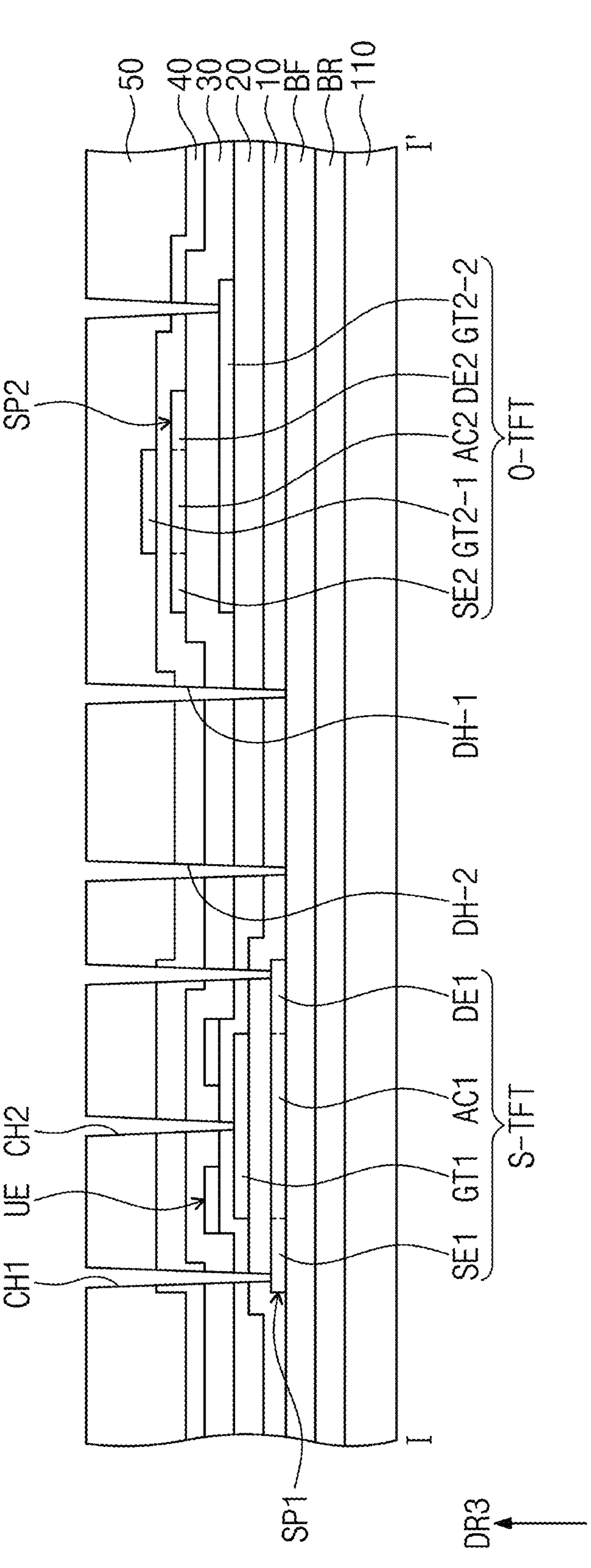
FIG. 12 schematically illustrates a manufacturing step of a display panel according to an embodiment.

Referring to FIG. 12, a second contact hole CH2 may be formed. The second contact hole CH2 may be formed such that the first gate GT1 of the silicon transistor S-TFT may be electrically connected to a corresponding signal line or light emitting element LD. The second contact hole CH2 may be formed to penetrate the second to fifth insulating layers 20, 30, 40, and 50 disposed above the first gate GT1.

Also, the second contact hole CH2 may be formed such that the third gate GT2-2 of the oxide transistor O-TFT may be electrically connected to a corresponding signal line or light emitting element LD. The second contact hole CH2 may be formed to penetrate the third to fifth insulating layers 30, 40, and 50. Forming the second contact hole CH2 may include etching, but may not include providing heat.

Figure 13:
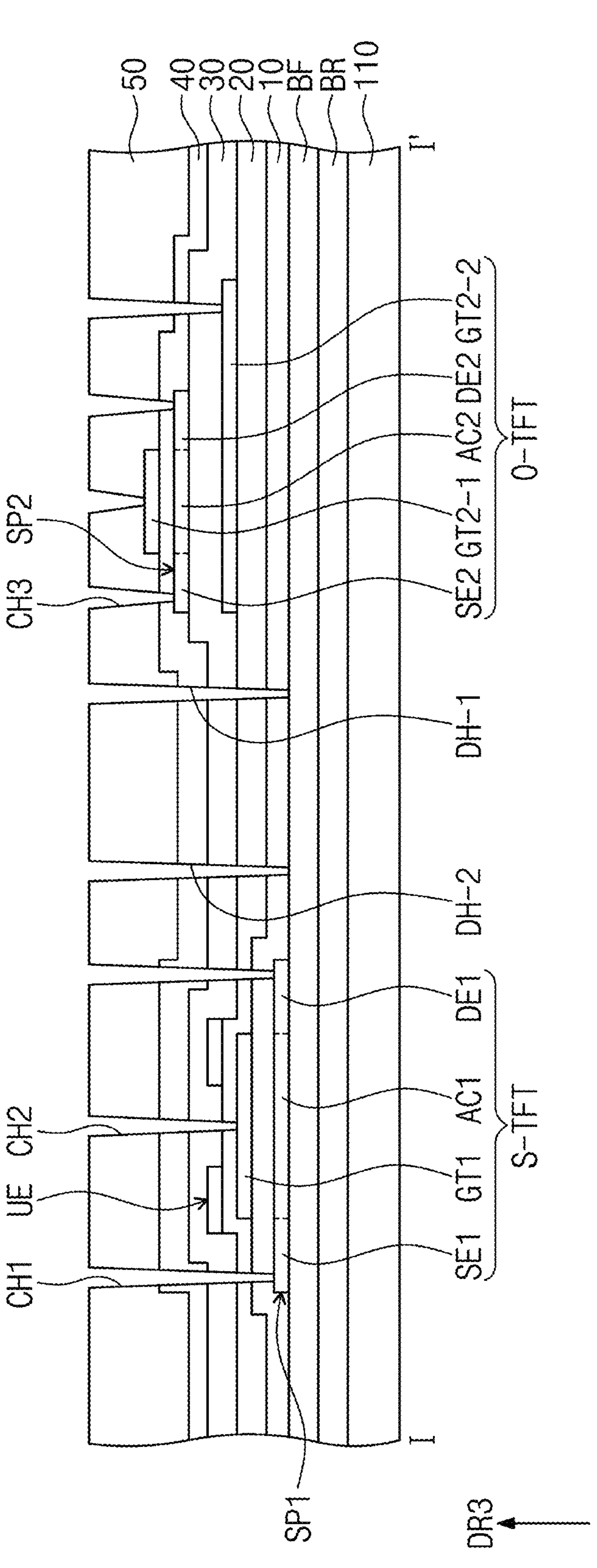
FIG. 13 schematically illustrates a manufacturing step of a display panel according to an embodiment.

Referring to FIG. 13, after the second contact hole CH2 is formed, the third contact hole CH3 may be formed. The third contact hole CH3 may be formed such that the second gate GT2-1 may be electrically connected to a corresponding signal line or light emitting element LD. The third contact hole CH3 may pass through the fifth insulating layer 50 disposed above the second gate GT2-1.

Also, the third contact hole CH3 may be formed such that the second semiconductor pattern SP2 may be electrically connected to a corresponding signal line or light emitting element LD. The third contact hole CH3 may be formed to pass through the fourth insulating layer 40 and the fifth insulating layer 50 disposed above the second semiconductor pattern SP2. The forming of the third contact hole CH3 may include etching and may not include providing heat.

Figure 14:
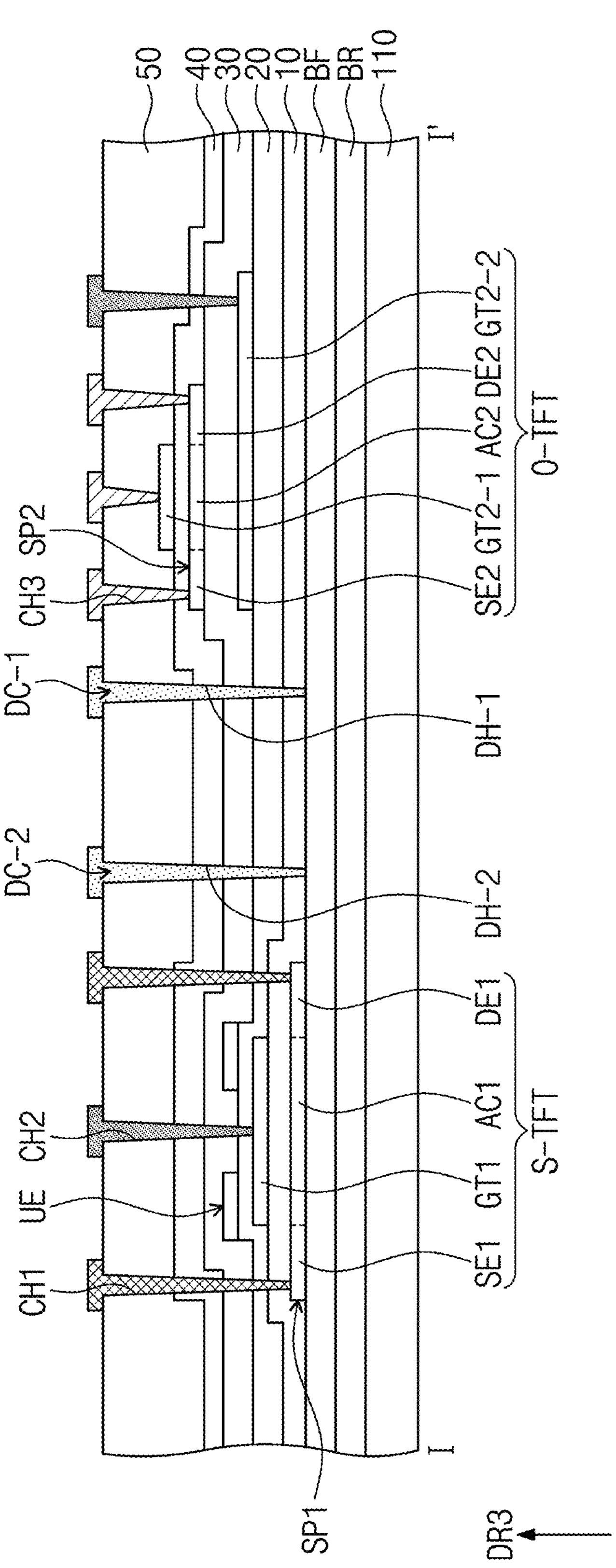
FIG. 14 schematically illustrates a manufacturing step of a display panel according to an embodiment.

FIG. 14 illustrates that a first dummy conductive pattern DC-1 may be formed by providing a first metal material to the first dummy hole DH-1 and a second dummy conductive pattern DC-2 may be formed by providing a second metal material to the second dummy hole DH-2. The first metal material and the second metal material may be the same. In addition, a metal material may be provided in the first to third contact holes CH1, CH2, and CH3. For example, the metal material provided in the first to third contact holes CH1, CH2, and CH3, the first metal material, and the second metal material may be the same. However, embodiments are not limited thereto, and at least one of the metal materials provided in the first to third contact holes CH1, CH2, and CH3 may be different from the first metal material.

Hereinafter, a display panel according to an embodiment of the disclosure will be described in detail with reference to an embodiment and a comparative example. The embodiments shown below are examples for helping understanding of the disclosure, and the scope of the disclosure is not limited thereto.

Figure 15A:
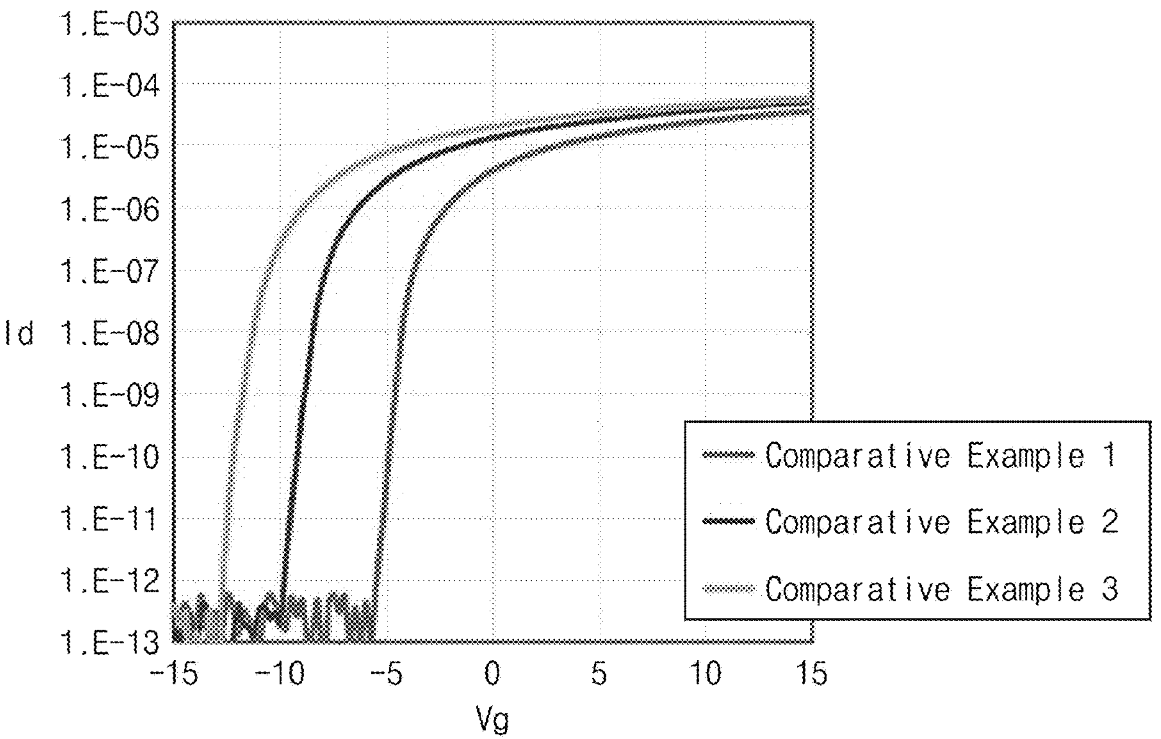
FIG. 15A is a schematic graph illustrating a current according to a voltage in a display panel of a comparative example.
Figure 15B:
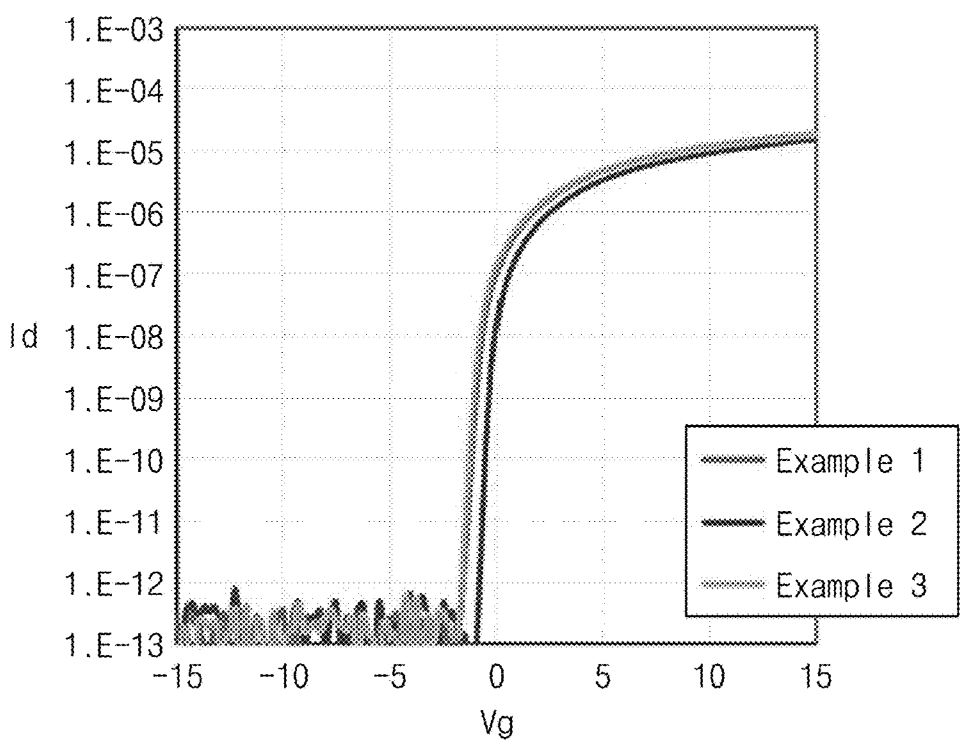
FIG. 15B is a schematic graph illustrating current according to voltage in the display panel according to an embodiment.

FIGS. 15A and 15B are schematic graphs illustrating a measurement of a current Id according to a voltage Vg of an oxide transistor in a display panel according to a comparative example and an embodiment. Comparative examples 1 to 3 of FIG. 15A are display panels in which dummy holes are not formed, and three identical display panels are provided. Examples 1 to 3 of FIG. 15B are display panels in which dummy holes are formed, and three identical display panels are provided. For example, examples 1 to 3 of FIG. 15B are display panels according to an embodiment.

Referring to FIGS. 15A and 15B, in comparison with comparative examples 1 to 3 of FIG. 15A, it may be seen that in examples 1 to 3 of FIG. 15B, the voltage shows a value close to zero, and the current value also shows a similar level. For example, it may be seen that the driving characteristics of examples 1 to 3 in which the dummy hole is formed are stabilized. In comparative examples 1 to 3 in which dummy holes are not formed are, as the dummy hole is not formed, it may be seen that the voltage shifts to a negative value, and the deviation of the current value is relatively large. For example, it may be seen that comparative examples 1 to 3 in which dummy holes are not formed have unstable driving characteristics. Accordingly, according to an embodiment, it is determined that the display panel having a dummy hole passing through the insulating layer in contact with the oxide transistor may exhibit excellent reliability.

FIGS. 16A to 16E are schematic graphs illustrating the measurement of the current Id according to the voltage Vg of the oxide transistor in the display panel according to an embodiment in which the dummy hole is formed. The examples of FIGS. 16A to 16E differ only in the separation distance between the dummy hole and the semiconductor pattern, and the separation distance is about 10 μm or less. For example, examples EA1 to EA3, EB1 to EB3, EC1 to EC3, ED1 to ED3, and EE1 to EE3 satisfy the separation distance range between the dummy hole and the semiconductor pattern according to the embodiment.

Figure 16A:
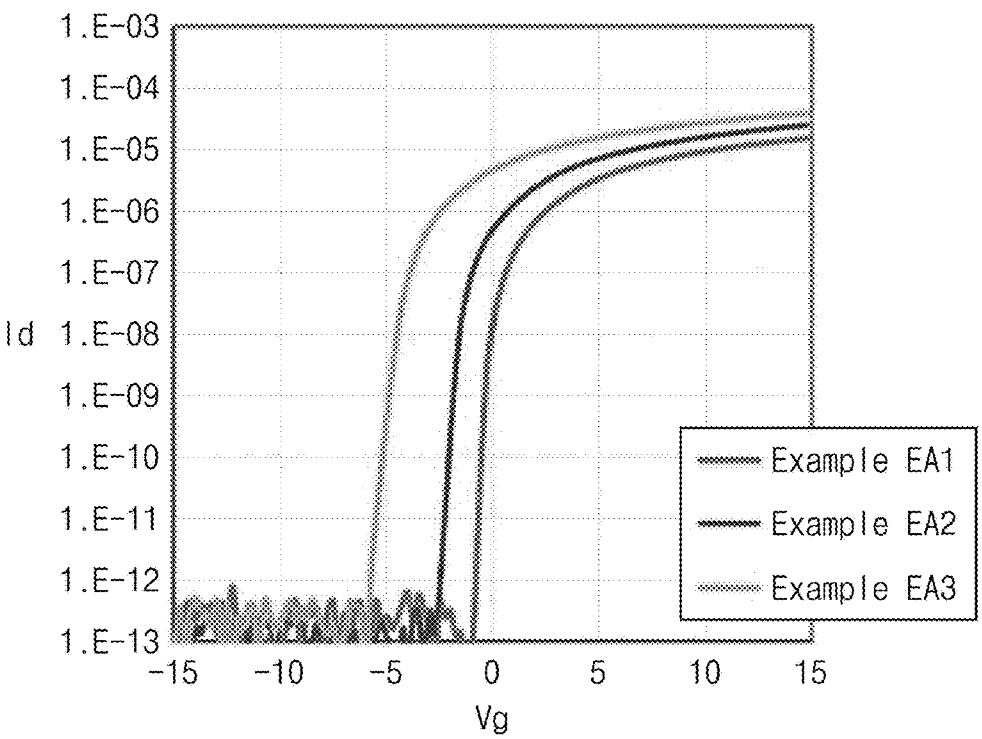
FIG. 16A is a schematic graph illustrating current according to voltage in the display panel according to an embodiment.
Figure 16B:
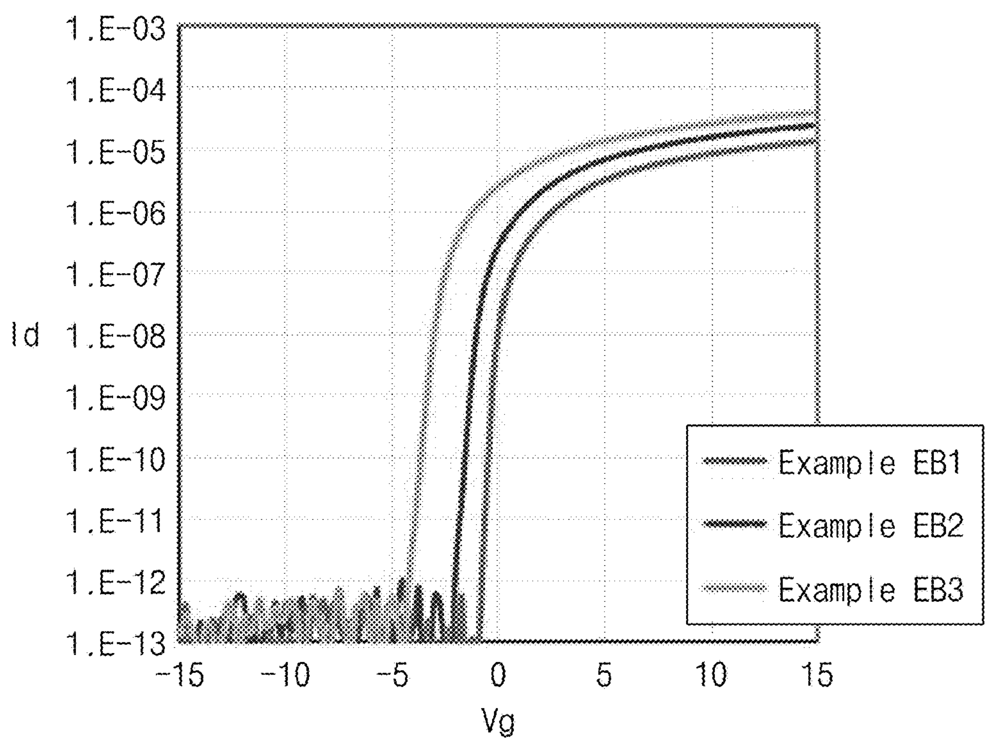
FIG. 16B is a schematic graph illustrating current according to voltage in the display panel according to an embodiment.
Figure 16C:
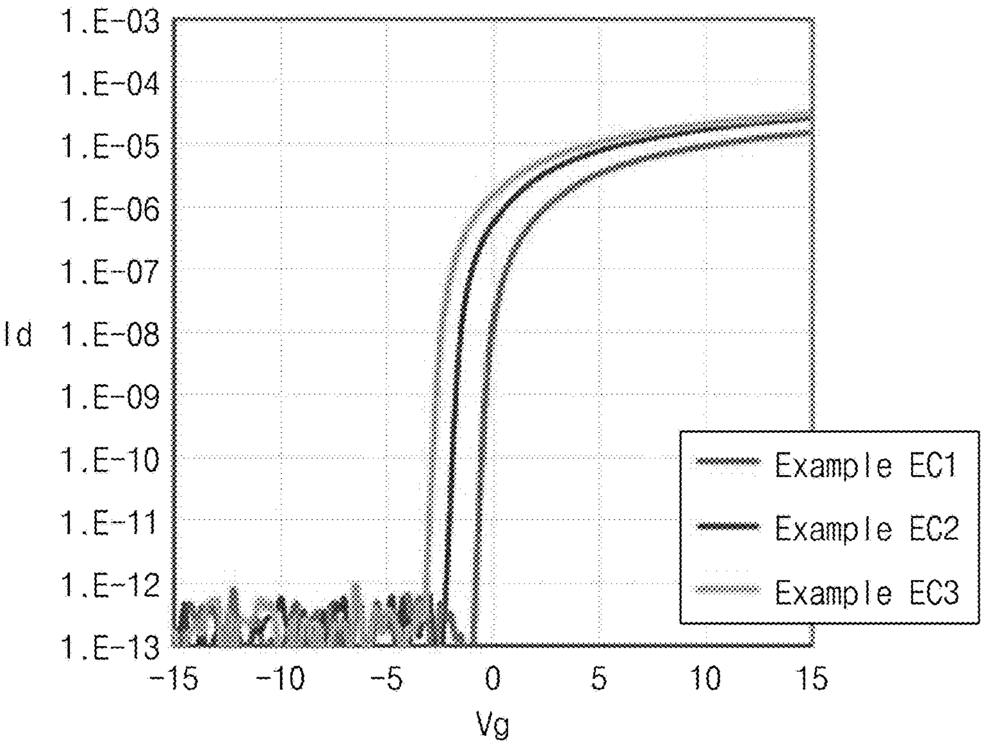
FIG. 16C is a schematic graph illustrating current according to voltage in the display panel according to an embodiment.
Figure 16D:
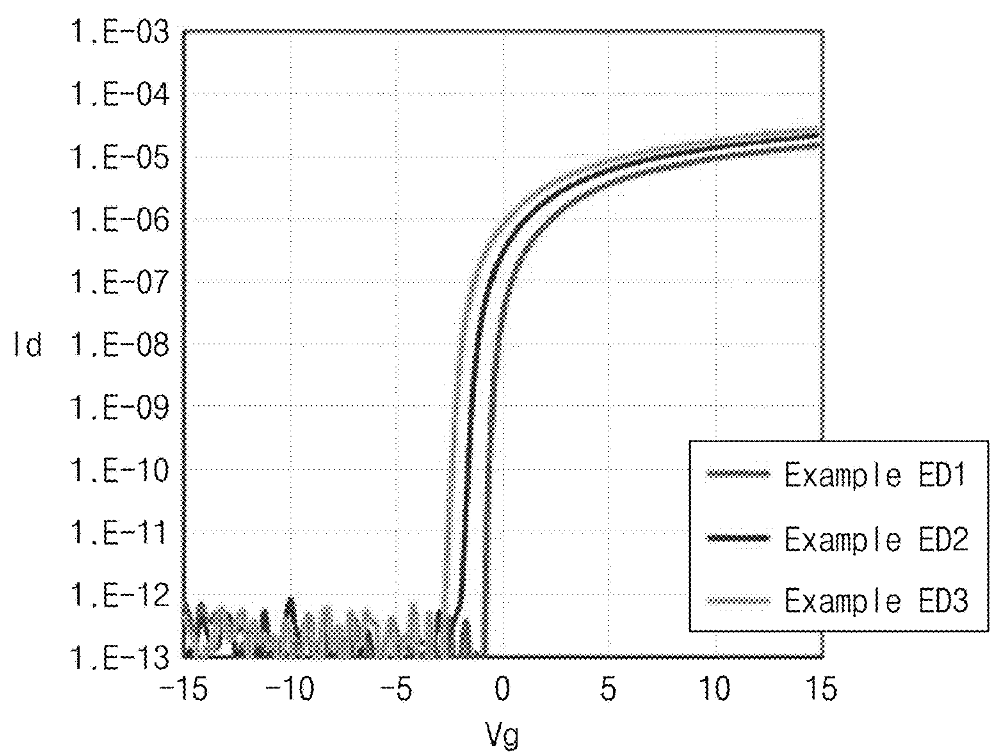
FIG. 16D is a schematic graph illustrating current according to voltage in the display panel according to an embodiment.
Figure 16E:
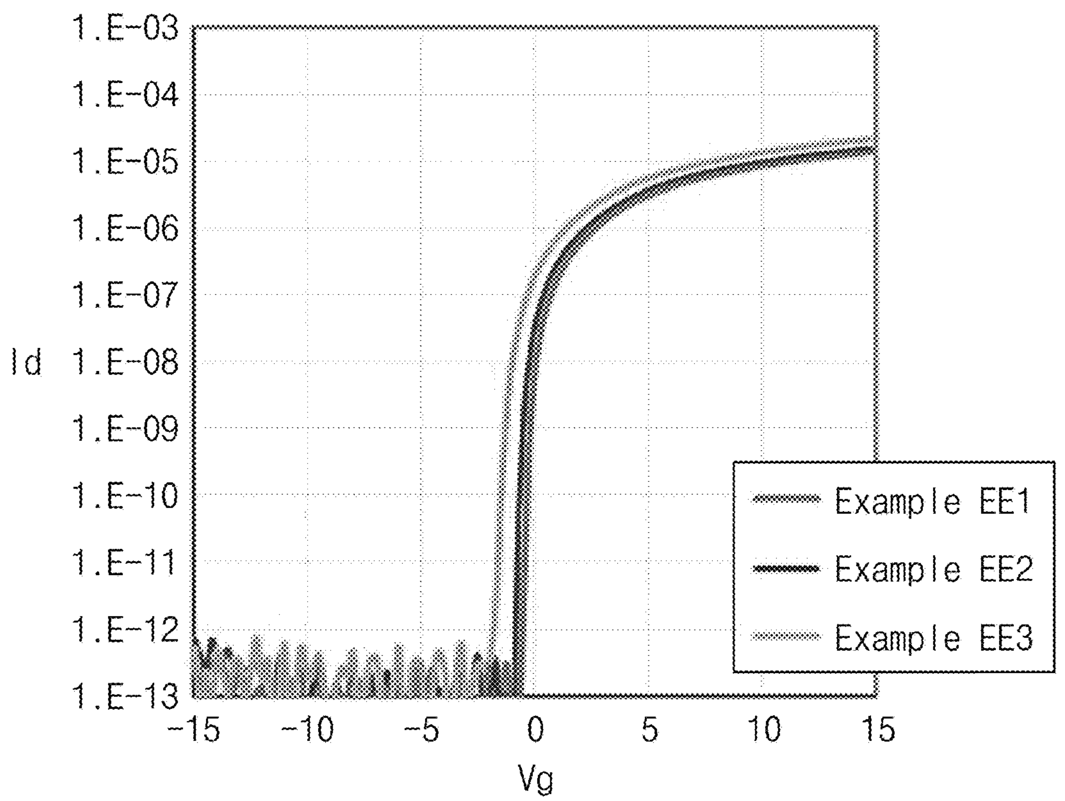
FIG. 16E is a schematic graph illustrating current according to voltage in the display panel according to an embodiment.

Examples EA1 to EA3 of FIG. 16A have a separation distance of about 7.4 μm, and three identical display panels are provided. Examples EB1 to EB3 of FIG. 16B have a separation distance of about 6.4 μm, and three identical display panels are provided. Examples EC1 to EC3 of FIG. 16C have a separation distance of about 5.4 μm, and three identical display panels are provided. Examples ED1 to ED3 of FIG. 16D have a separation distance of about 4.4 μm, and three identical display panels are provided. Examples EE1 to EE3 of FIG. 16E have a separation distance of about 3.4 μm, and three identical display panels are provided.

Referring to FIGS. 16A to 16E, it may be seen that the driving characteristics of the oxide transistor are stabilized in the display panel according to an embodiment in which the separation distance between the dummy hole and the semiconductor pattern is about 10 μm or less. In addition, it may be seen that the oxide transistor exhibits excellent driving characteristics as the separation distance becomes relatively short. Accordingly, in an embodiment, in the display panel having a separation distance between the dummy hole and the semiconductor pattern of about 10 μm or less, driving characteristics of the transistor may be stabilized.

A method of manufacturing a display panel according to an embodiment may include sequentially forming an oxide semiconductor pattern, a first insulating layer, and a gate on an upper side of a base layer, and forming a dummy hole to be spaced apart from the oxide semiconductor pattern and the gate. Also, the method of manufacturing a display panel according to an embodiment may include forming a dummy conductive pattern by providing a metal material in the dummy hole. The first insulating layer may be formed to contact the oxide semiconductor pattern and the gate, and the dummy hole may be formed to penetrate the first insulating layer. The dummy hole is formed to pass through the first insulating layer in contact with the transistor including the oxide semiconductor pattern, and may be used as a passage for removing unnecessary hydrogen. Accordingly, the method of manufacturing a display panel according to an embodiment including forming a dummy hole through the first insulating layer in contact with the transistor including the oxide semiconductor pattern may exhibit excellent manufacturing reliability.

The display panel according to an embodiment may include insulating layers, a light emitting element disposed on the insulating layers, and a transistor electrically connected to the light emitting element. The transistor may include an oxide semiconductor pattern and a gate disposed on the oxide semiconductor pattern. In the display panel of an embodiment, a first dummy hole passing through contact insulating layers in contact with a transistor including an oxide semiconductor pattern among the insulating layers may be defined, and a first dummy conductive pattern may be disposed in the first dummy hole. The display panel according to an embodiment in which the first dummy hole is defined may exhibit excellent reliability as hydrogen may be discharged.

The display panel according to an embodiment may exhibit excellent reliability by including a dummy hole penetrating the insulating layers in contact with the transistor.

In the method of manufacturing a display panel according to an embodiment, manufacturing reliability may be improved by including forming a dummy hole penetrating insulating layers in contact with a transistor.

Although embodiments of the disclosure have been described, it is understood that the disclosure should not be limited to these embodiments but various changes and modifications may be made by one of ordinary skill in the art within the spirit and scope of the disclosure.

What is claimed is:

1. A display device including a display panel, the display panel comprising:

a plurality of insulating layers;

a light emitting element disposed above the plurality of insulating layers;

a first transistor including:

an oxide semiconductor pattern; and a first gate disposed above the oxide semiconductor pattern; and a first dummy conductive pattern spaced apart from the first transistor, wherein a first dummy hole is defined spaced apart from the first transistor in a direction perpendicular to a thickness direction, and penetrating first contact insulating layers in contact with at least the first transistor among the plurality of insulating layers, and the first dummy conductive pattern is disposed in the first dummy hole, and wherein the first contact insulating layers comprise a first insulating layer disposed between the oxide semiconductor pattern and the first gate, and the first dummy hole penetrates the first insulating layer.

2. The display device of claim 1, wherein in the direction perpendicular to the thickness direction, a first separation distance between the first dummy hole and the oxide semiconductor pattern is about 10 μm or less.

3. The display device of claim 1, further comprising a buffer layer disposed below the plurality of insulating layers, wherein an upper surface of the buffer layer is exposed through the first dummy hole.

4. The display device of claim 1, wherein the display device is a television, a mobile phone, a tablet computer, a navigation device, or a game machine.

5. A display device including a display panel, the display panel comprising:

a plurality of insulating layers;

a light emitting element disposed above the plurality of insulating layers;

a first transistor including:

an oxide semiconductor pattern; and a first gate disposed above the oxide semiconductor pattern; and a first dummy conductive pattern spaced apart from the first transistor, wherein a first dummy hole is defined spaced apart from the first transistor in a direction perpendicular to a thickness direction, and penetrating first contact insulating layers in contact with at least the first transistor among the plurality of insulating layers, the first dummy conductive pattern is disposed in the first dummy hole, the display panel includes a display area and a non-display area, and the first dummy hole overlaps the display area.

6. The display device of claim 5, wherein the display device is a television, a mobile phone, a tablet computer, a navigation device, or a game machine.

7. A display device including a display panel, the display panel comprising:

a plurality of insulating layers;

a light emitting element disposed above the plurality of insulating layers;

a first transistor including:

an oxide semiconductor pattern; and a first gate disposed above the oxide semiconductor pattern;

a first dummy conductive pattern spaced apart from the first transistor;

a second transistor disposed above a layer different from the first transistor; and a second dummy conductive pattern spaced apart from the second transistor, wherein a first dummy hole is defined spaced apart from the first transistor in a direction perpendicular to a thickness direction, and penetrating first contact insulating layers in contact with at least the first transistor among the plurality of insulating layers, and the first dummy conductive pattern is disposed in the first dummy hole, the second transistor comprises a silicon semiconductor pattern and a second gate disposed above the silicon semiconductor pattern, a second dummy hole passing through second contact insulating layers in contact with at least the second transistor among the plurality of insulating layers is defined, and the second dummy conductive pattern is disposed in the second dummy hole.

8. The display device of claim 7, wherein in the direction perpendicular to the thickness direction, a second separation distance between the second dummy hole and the silicon semiconductor pattern is about 10 μm or less.

9. The display device of claim 7, wherein the second contact insulating layers comprise a second insulating layer disposed between the silicon semiconductor pattern and the second gate, and the second dummy hole penetrates the second insulating layer.

10. The display device of claim 9, wherein the first dummy hole penetrates the second insulating layer.

11. The display device of claim 7, further comprising an upper electrode disposed above the second gate.

12. The display device of claim 7, wherein the first dummy conductive pattern and the second dummy conductive pattern comprise a same metal material.

13. The display device of claim 7, wherein the display device is a television, a mobile phone, a tablet computer, a navigation device, or a game machine.

* * * * *